(12) United States Patent
Liu et al.

(10) Patent No.: US 11,442,124 B2
(45) Date of Patent: Sep. 13, 2022

(54) SUPERCONDUCTING MAGNET

(71) Applicant: SHANGHAI UNITED IMAGING HEALTHCARE CO., LTD., Shanghai (CN)

(72) Inventors: Jianfeng Liu, Shanghai (CN); Yanqing Cai, Shanghai (CN); Lijun Zou, Shanghai (CN); Jin Qian, Shanghai (CN); Jian Gu, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 0 days.

(21) Appl. No.: 16/924,336

(22) Filed: Jul. 9, 2020

(65) Prior Publication Data

US 2021/0096197 A1 Apr. 1, 2021

(30) Foreign Application Priority Data

Sep. 26, 2019 (CN) .......................... 201910916087.X
Dec. 13, 2019 (CN) .......................... 201911283106.6
Feb. 19, 2020 (CN) .......................... 202020184705.4

(51) Int. Cl.
*G01R 33/34* (2006.01)
*H01F 6/06* (2006.01)
*H01F 6/04* (2006.01)

(52) U.S. Cl.
CPC . *G01R 33/34023* (2013.01); *G01R 33/34007* (2013.01); *H01F 6/04* (2013.01); *H01F 6/06* (2013.01)

(58) Field of Classification Search
CPC ........ G01R 33/34023; H01F 6/04; H01F 6/06
See application file for complete search history.

(56) References Cited

U.S. PATENT DOCUMENTS

| 6,218,923 | B1* | 4/2001 | Laskaris | ............ | G01R 33/3873 |
| | | | | | 335/216 |
| 6,812,705 | B1 | 11/2004 | Sellers | | |
| 6,998,947 | B2* | 2/2006 | Penn | ........................ | F17C 3/085 |
| | | | | | 324/318 |
| 8,305,173 | B2 | 11/2012 | Tamura | | |
| 9,322,892 | B2* | 4/2016 | Shen | ........................ | H01F 6/06 |
| 10,041,720 | B2* | 8/2018 | Simpkins | .................. | H01F 6/04 |

(Continued)

FOREIGN PATENT DOCUMENTS

| CN | 203433928 U | 2/2014 |
| CN | 103901371 A | 7/2014 |

(Continued)

*Primary Examiner* — Alexander Talpalatski
(74) *Attorney, Agent, or Firm* — Metis IP LLC

(57) ABSTRACT

A superconducting magnet may include magnet coils including at least one group of outer coils and at least one group of inner coils, a container including an accommodating space, at least one first chamber that is disposed within the accommodating space and houses the at least one group of the inner coils, and at least one second chamber that is disposed within the accommodating space and houses the at least one group of the outer coils. The at least one first chamber and the at least one second chamber may be configured to be filled with a cooling medium and are in fluid communication with each other. The cooling medium may be configured to cool the magnet coils to a superconducting state.

13 Claims, 16 Drawing Sheets

(56) References Cited

U.S. PATENT DOCUMENTS

| | | |
|---|---|---|
| 10,317,013 B2 | 6/2019 | Ham |
| 10,365,338 B2 | 7/2019 | Jonas et al. |
| 2007/0120564 A1 | 5/2007 | Huang et al. |
| 2010/0051307 A1 | 3/2010 | Tigwell et al. |
| 2014/0114175 A1 | 4/2014 | Harrison |
| 2016/0187435 A1* | 6/2016 | Jiang .................. G01R 33/3804 324/322 |
| 2017/0299250 A1* | 10/2017 | Simpkins .............. F25D 19/006 |
| 2018/0144851 A1 | 5/2018 | Li et al. |
| 2019/0154772 A1 | 5/2019 | Ham |
| 2020/0058423 A1 | 2/2020 | Hu et al. |
| 2021/0080527 A1 | 3/2021 | Wang et al. |

FOREIGN PATENT DOCUMENTS

| | | |
|---|---|---|
| CN | 204720270 U | 10/2015 |
| CN | 106531396 A | 3/2017 |
| CN | 107134339 A | 9/2017 |
| CN | 107991635 A | 5/2018 |
| CN | 207651280 U | 7/2018 |
| CN | 108962484 A | 12/2018 |
| CN | 110082695 A | 8/2019 |
| CN | 110244244 A | 9/2019 |
| JP | 2005121455 A | 5/2005 |

\* cited by examiner

SUPERCONDUCTING MAGNET

CROSS-REFERENCE TO RELATED APPLICATIONS

This application claims priority to Chinese Patent Application No. 201910916087.X filed on Sep. 26, 2019, Chinese Patent Application No. 201911283106.6 filed on Dec. 13, 2019, and Chinese Patent Application No. 202020184705.4 filed on Feb. 19, 2020, the contents of each of which are incorporated herein by reference.

TECHNICAL FIELD

The present disclosure generally relates to magnetic resonance imaging (MRI), and in particular, to a superconducting magnet in an MRI system.

BACKGROUND

With the development of medical imaging, MRI has become an important medical diagnosis technology and play an increasingly important role in medical diagnosis. In MRI devices, a superconducting magnet provides a main magnetic field. Keeping magnet coils of the superconducting magnet in a superconducting state has a greater influence on the image quality of MRI.

SUMMARY

According to an aspect of the present disclosure, a superconducting magnet may include magnet coils including at least one group of outer coils and at least one group of inner coils, a container including an accommodating space, at least one first chamber that is disposed within the accommodating space and houses the at least one group of the inner coils, and at least one second chamber that is disposed within the accommodating space and houses the at least one group of the outer coils. The at least one first chamber and the at least one second chamber may be configured to be filled with a cooling medium and are in fluid communication with each other. The cooling medium may be configured to cool the magnet coils to a superconducting state.

In some embodiments, the superconducting magnet may include a third chamber disposed within the accommodating space. The at least one first chamber and the at least one second chamber may be in fluid communication with each other through the third chamber.

In some embodiments, the superconducting magnet may include an intermediate support structure disposed within the accommodating space, a first sealing structure disposed within the accommodating space, and a plate structure disposed between the first sealing structure and the intermediate support structure. The first sealing structure may be located closer to a central axis of the superconducting magnet than the intermediate support structure. The at least one first chamber may be formed based on the intermediate support structure, the first sealing structure, and the plate structure.

In some embodiments, the superconducting magnet may include an inner support structure disposed within the at least one first chamber. The at least one group of inner coils may be disposed on the inner support structure.

In some embodiments, the at least one group of the inner coils may be disposed on the intermediate support structure or the sealing structure.

In some embodiments, the superconducting magnet may include an outer support structure disposed within the accommodating space, and a second sealing structure disposed within the accommodating space. The at least one group of outer coils may be disposed on the outer support structure. The intermediate support structure may be located closer to the central axis of the superconducting magnet than the outer support structure. The outer support structure may be located closer to the intermediate support structure than second sealing structure. The at least one second chamber may be formed based on the outer support structure and the second sealing structure.

In some embodiments, the superconducting magnet may include a refrigeration device configured to cool the cooling medium. The refrigeration device may be thermally coupled with at least one of the at least one first chamber, the at least one second chamber, or the third chamber. The refrigeration device may be disposed on the container. At least a portion of the refrigeration device may be located outside the accommodating space.

In some embodiments, a cold head of the refrigeration device may extend into the accommodating space and may be thermally coupled with at least one of the at least one first chamber, the at least one second chamber, or the third chamber.

In some embodiments, the superconducting magnet may include a cooling chamber including the at least one first chamber, the at least one second chamber, and the third chamber, and an outer chamber that is formed based on an outer wall of the cooling chamber and an inner wall of the container. The accommodating space may be formed based on the inner wall of the container.

In some embodiments, the refrigeration device may be in sealing connection with the cooling chamber so that the cooling chamber is separated from the outer chamber.

In some embodiments, the superconducting magnet may include a connection passage connecting the refrigeration device and the cooling chamber, an exhaust passage disposed on the connection passage, and a control valve that is disposed on the connection passage and configured to control a fluid communication between the outer chamber and the cooling chamber.

In some embodiments, the superconducting magnet may include a connection passage connecting the refrigeration device and the cooling chamber. The connection passage may include at least one opening. The cooling chamber may be in fluid communication with the outer chamber through the at least one opening.

In some embodiments, there may be a gap between the at least one group of inner coils and the at least one first chamber, or the at least one group of outer coils and the at least one second chamber. The gap may be configured to be filled with the cooling medium.

According to another aspect of the present disclosure, a superconducting magnet may include magnet coils, a support structure on which the magnet coils are disposed, and a shell structure disposed around the magnet coils. At least one chamber may be formed based on the support structure and the shell structure. The at least one chamber may be configured to be filled with a cooling medium. The cooling medium may be configured to cool the magnet coils to a superconducting state.

In some embodiments, at least a portion of the magnet coils may be in thermal contact with the cooling medium.

In some embodiments, the shell structure may be an arc structure that extends along a circumferential direction of the magnet coils.

In some embodiments, the shell structure may be a circle structure that is arranged around a periphery of the magnet coils.

In some embodiments, the superconducting magnet may include a refrigeration device configured to cool the cooling medium, and a thermal conduction structure including a first end and a second end. The first end may be thermally coupled with the cooling medium. The second end may be thermally coupled with the refrigeration device. The thermal conduction structure may be configured to facilitate heat transfer between the refrigeration device and the cooling medium to cool the cooling medium.

In some embodiments, the shell structure may include a hole. The first end of the thermal conduction structure may enter the at least one chamber through the hole and may be configured to be immersed in the cooling medium.

In some embodiments, a material of the shell structure may be metal. The first end of the thermal conduction structure may be thermally connected with the shell structure. The thermal conduction structure may be configured to facilitate heat transfer between the refrigeration device and the cooling medium through the shell structure.

In some embodiments, the superconducting magnet may include a vacuum container including an accommodating space in which the magnet coils, the support structure, and the shell structure are disposed. The refrigeration device may be disposed on the vacuum container. A cold head of the refrigeration device may extend into the accommodating space.

In some embodiments, the at least one chamber may include multiple chambers that are in thermal communication with each other.

According to yet another aspect of the present disclosure, a method for cooling a magnetic resonance imaging (MRI) device is provided. The MRI device may include magnet coils, a support structure on which the magnet coils are disposed, a shell structure disposed around the magnet coils, a vacuum container including an accommodating space in which the magnet coils, the support structure, and the shell structure are disposed, and a refrigeration device disposed on the vacuum container. At least one chamber may be formed based on the shell structure and the support structure. A cold head of the refrigeration device may extend to the accommodating space of the vacuum container. The method may include filling the at least one chamber with a liquid cooling medium, and cooling, by the refrigeration device through thermal conduction, the liquid cooling medium to a solid state to cool the magnet coils.

According to yet another aspect of the present disclosure, a superconducting magnet may include at least one group of magnet coils, a support structure on which the at least one group of magnet coils are disposed, and at least one cooling structure configured to cool the at least one group of magnet coils to a superconducting state through a cooling medium. Each of the at least one cooling structure may include a cooling body including a cooling passage configured to allow the cooling medium to pass through, an end cover including two end components respectively disposed on two ends of the cooling body along a flow direction of the cooling medium in the cooling body, and a plurality of pipes configured to allow the cooling medium to enter or exit the cooling body. The cooling body may be in thermal contact with at least a portion of the at least one group of magnet coils. Each of the two end components may be provided with at least one of the plurality of pipes.

In some embodiments, the each of the at least one cooling structure may include a plurality of strengthening structures that are disposed in the cooling passage and configured to strengthen the cooling body.

In some embodiments, the plurality of strengthening structures may be attached to a top wall and a bottom wall of the cooling passage.

In some embodiments, for one of the two end components that is disposed on one of the two ends of the cooling body, at least one end of the part may protrude beyond a side of the cooling body. The side of the cooling body may be between the two ends of the cooling body. The at least one pipe may be disposed on the at least one protruding end.

In some embodiments, the at least one cooling structure may be disposed so that the cooling passage of the at least one cooling structure extends along a circumferential direction of the support structure.

In some embodiments, the at least one cooling structure may include multiple cooling structures that are mechanically connected side by side through at least one end cover so that the multiple cooling structures are disposed along an axial direction of the support structure.

In some embodiments, the at least one cooling structure may be located between the support structure and the at least one group of magnet coils.

In some embodiments, the at least one group of magnet coils may include more than one coil that is stacked around the support structure along a radial direction of the support structure. The at least one cooling structure may be disposed between any neighboring coils of the more than one coil.

In some embodiments, the at least one group of magnet coils may be disposed around a periphery of the at least one group of magnet coils.

In some embodiments, a size of the at least one cooling body along an axial direction of the support structure may be less than or equal to a size of the at least one group of magnet coils along the axial direction of the support structure.

In some embodiments, the support structure may include an opening configured to accommodate the at least one pipe.

In some embodiments, the superconducting magnet may include a refrigeration device that is thermally connected with the at least one cooling structure and configured to cool the cooling medium in the at least one cooling passage.

According to yet another aspect of the present disclosure, a cooling structure configured to cool magnet coils of a superconducting magnet through a cooling medium is provided. The cooling structure may include a cooling body including a cooling passage configured to allow the cooling medium to pass through, an end cover including two end components respectively disposed on two ends of the cooling body along a flow direction of the cooling medium in the cooling body, and at least one pipe that is disposed on each of the two end components and configured to allow the cooling medium to enter or exit the cooling body. The cooling body may be in contact with at least a portion of the magnet coils.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1A:
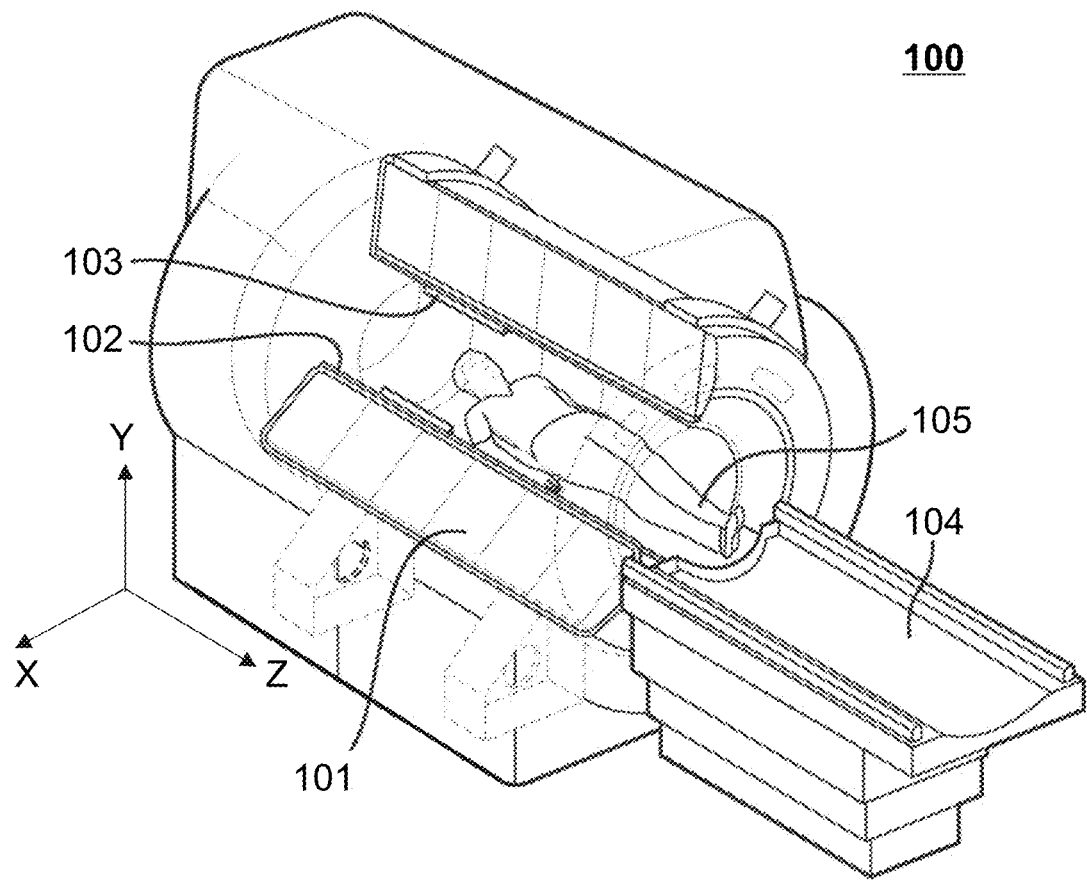
FIG. 1A is a schematic diagram illustrating an exemplary MRI system according to some embodiments of the present disclosure.
Figure 1B:
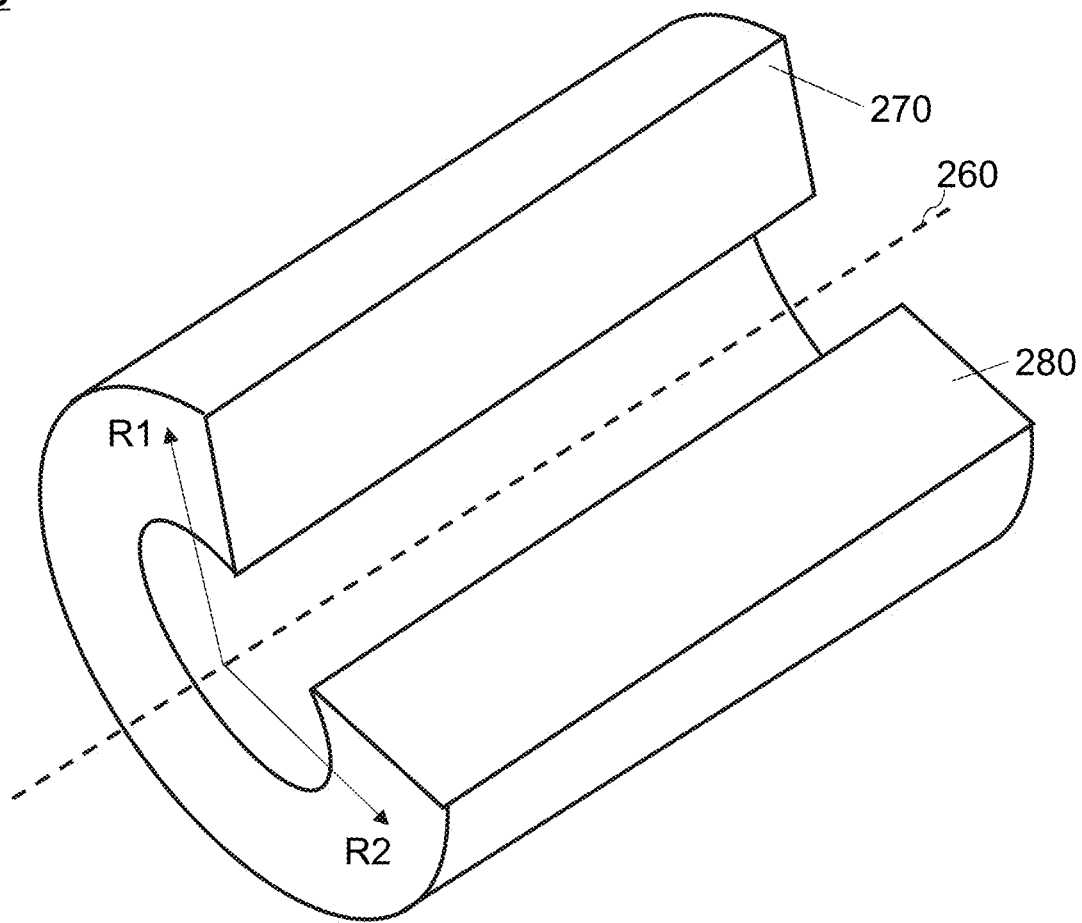
FIG. 1B and FIGS. 2-5 are schematic diagrams illustrating a cross-section of a portion of an exemplary superconducting magnet according to some embodiments of the present disclosure.
Figure 2:
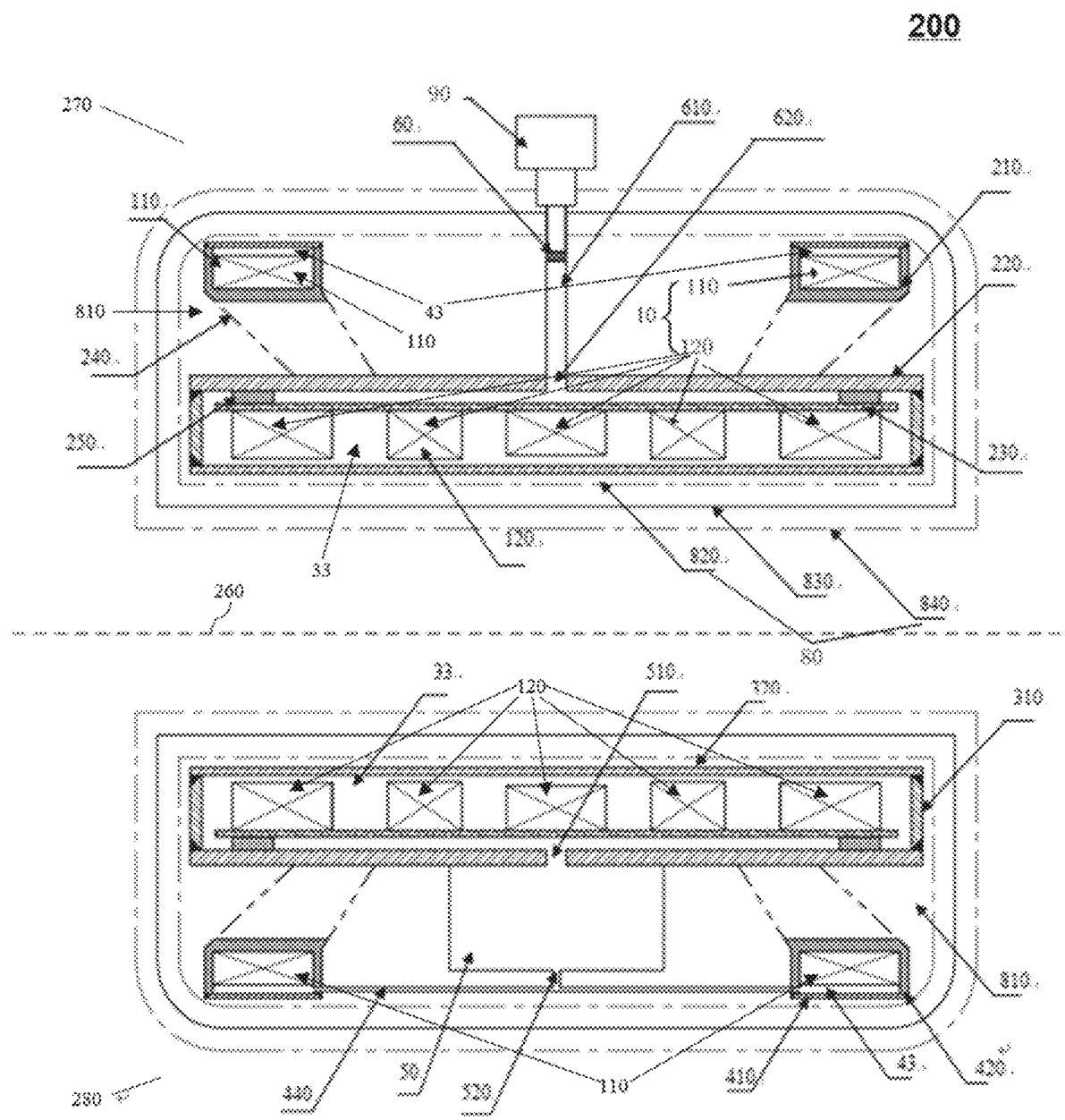

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different levels in ascending order. However, the terms may be displaced by another expression if they achieve the same purpose.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guided radiotherapy (IGRT) system, etc. The image-guided radiotherapy (IGRT) system may include a treatment device and an imaging device. The treatment device may include a linear accelerator, a cyclotron, a synchrotron, etc., configured to perform a radiotherapy on a subject. The treatment device may include an accelerator of species of particles including, for example, photons, electrons, protons, or heavy ions. The imaging device may include an MRI scanner, a CT scanner (e.g., cone beam computed tomography (CBCT) scanner), a digital radiology (DR) scanner, an electronic portal imaging device (EPID), etc.

An aspect of the present disclosure relates to a superconducting magnet. The superconducting magnet may include a container, at least one first chamber, at least one second chamber, and magnet coils including at least one group of inner coils and at least one group of outer coils. The at least one first chamber, the at least one second chamber, the at least one group of inner coils, and the at least one group of outer coils may be disposed within the container. The at least one first chamber may house the at least one group of inner coils. The at least one second chamber may house the at least one group of outer coils. The at least one first chamber and the at least one second chamber may be in fluid communication. A cooling chamber may be formed based on the at least one first chamber and the at least one second chamber. The cooling chamber may be filled with a cooling medium configured to cool the magnet coils to and/or maintain them at a superconducting state. The size and shape of the cooling chamber may be set according to actual needs, thereby reducing the consumption of the cooling medium.

Another aspect of the present disclosure relates to a superconducting magnet system. The superconducting magnet system may include magnet coils, a support structure, a shell structure, a thermal conduction structure, and a refrigeration device. At least one chamber may be formed based on the support structure and the shell structure. The at least one chamber may be configured to be filled with a cooling medium configured to cool the magnet coils to and/or maintain them at a superconducting state.

Due to its fluidity, a liquid cooling medium may be evenly distributed in the at least one chamber. When the liquid cooling medium is cooled, the cooling medium may transform to a solid status. The solidified cooling medium may evenly cover the surface of the magnet coils, thereby forming a good thermal contact between the cooling medium and the magnet coils to facilitate heat transfer between the cooling medium and the magnet coils. Therefore, the cooling medium may alleviate uneven or localized heating of the magnet coils, thereby in turn reducing the risk of quenching of superconductivity of the magnet coils.

Yet another aspect of the present disclosure relates to a cooling structure configured to be applied in an MRI system to cool magnet coils of the MRI system to a superconducting state. The cooling structure may include a cooling body, an end cover, and a plurality of pipes. When the cooling structure is applied in an MRI system to cool magnet coils of the MRI system, the cooling body may be in thermal contact with the magnet coils. A cooling medium may enter the cooling body through at least one of plurality of pipes disposed on the end cover. The cooling medium may flow in the cooling body to cool the magnet coils through heat transfer. Using the cooling structure filled with the cooling medium to cool the magnet coils may effectively solve the problem of large consumption of liquid helium caused by immerging the magnet coils in liquid helium, without compromising the cooling of the magnet coils, thereby greatly reducing the consumption of the cooling medium, reducing costs, reducing waste of the cooling medium, which in turn may simplify the manufacturing, transportation, and/or maintenance of the MRI system.

FIG. 1A is a schematic diagram illustrating an exemplary MRI system 100 according to some embodiments of the present disclosure.

The MRI system 100 may be configured to scan an object (e.g., an object 105 in FIG. 1A) located within its detection region and generate a plurality of imaging data relating to the object. In the present disclosure, "subject" and "object" are used interchangeably. Mere by way of example, the object may include a patient, a man-made object, etc. As another example, the object may include a specific portion, organ, and/or tissue of a patient. For example, the object may include the head, the brain, the neck, the torso, a shoulder, an arm, the thorax, the heart, the stomach, a blood vessel, soft tissue, a knee, feet, or the like, or any combination thereof.

In some embodiments, the MRI system 100 may include an MRI scanner, a multi-modality device, etc. Exemplary multi-modality devices may include an MRI-CT device, a PET-MRI device, etc. In some embodiments, the MRI scanner may be a close-bore scanner or an open-bore scanner.

In the present disclosure, the X axis, the Y axis, and the Z axis shown in FIG. 1A may form an orthogonal coordinate system. The X axis and the Z axis shown in FIG. 1A may be horizontal, and the Y axis may be vertical. As illustrated, the positive X direction along the X axis may be from the right side to the left side of the MRI system 100 seen from the direction facing the front of the MRI system 100; the positive Y direction along the Y axis shown in FIG. 1A may be from the lower part to the upper part of the MRI system 100; the positive Z direction along the Z axis shown in FIG. 1A may refer to a direction in which the object 105 is moved out of the scanning channel (or referred to as the bore) of the MRI system 100.

As illustrated, the MRI system 100 may include a magnet system 101, gradient coils 102, radio frequency (RF) coils 103, and a patient table 104 configured to hold an object (e.g., the object 105).

The magnet system 101 may generate a first magnetic field (or referred to as a main magnetic field) that may be applied to the object 105 exposed inside the field. The magnet system 101 may include a resistive magnet or a superconducting magnet that both need a power supply (not shown) for operation. Alternatively, the magnet system 101 may include a permanent magnet. The magnet system 101 may include a bore that the object 105 is placed within. The magnet system 101 may also control the homogeneity of the generated main magnetic field. Some shim coils may be in the magnet system 101. The shim coils placed in the gap of the magnet system 101 may compensate for the inhomogeneity of the magnetic field of the magnet system 101. The shim coils may be energized by a shim power supply.

The gradient coils 102 may be located inside the magnet system 101. The gradient coils 102 may generate a second magnetic field (or referred to as a gradient field). The second magnetic field may be superimposed on the main field generated by the magnet system 101 and distort the main field so that the magnetic orientations of the protons of an object (e.g., the object 105) may vary as a function of their positions inside the gradient field, thereby encoding spatial information into MR signals generated by the object being imaged.

The radio frequency (RF) coils 103 may be located inside the magnet system 101 and serve as transmitters, receivers, or both. When used as transmitters, the RF coils 103 may generate RF signals that provide a third magnetic field that is utilized to generate MR signals related to an object (e.g., the object 105) being imaged. The third magnetic field may be perpendicular to the main magnetic field. When used as receivers, the RF coils may be responsible for detecting MR signals (e.g., echoes). After excitation, the MR signals generated by the object 105 may be sensed by the RF coils 103.

In some embodiments, the gradient coils 102 and the RF coils 103 may be circumferentially positioned with respect to the object 105. It is understood by those skilled in the art that the magnet system 101, the gradient coils 102, and the RF coils 103 may be situated in a variety of configurations around the object 105.

The present disclosure provides a superconducting magnet that may be applied in an MRI system (e.g., the MRI system 100).

Merely by way of example, FIGS. 2-5 are schematic diagrams illustrating a cross-section of a portion of an exemplary superconducting magnet according to some embodiments of the present disclosure. In some embodiments, the superconducting magnet 200 may be applied in an MRI system (e.g., the MRI system 100). In some embodiments, the superconducting magnet 200 may be a cylinder with a bore. The superconducting magnet 200 may be around and centered on a central axis 260. When the superconducting magnet 200 is used (e.g., installed) in the MRI system 100, the central axis 260 may be parallel to the Z axis in FIG. 1A. In the MRI system 100, the superconducting magnet 200 may be circumferentially positioned with respect to the object 105.

As shown in FIGS. 1B and 2-5, the cross-section 270 may refer to a cross-section of a portion of the superconducting magnet 200 along a first radial direction (e.g., the direction R1 in FIG. 1B) of the superconducting magnet 200. The cross-section 280 may refer to a cross-section of a portion of the superconducting magnet 200 along a second radial direction (e.g., the direction R2 in FIG. 1B) of the superconducting magnet 200.

In some embodiments, as shown in FIGS. 2-5, the superconducting magnet 200 may include a container 80, at least one first chamber 33, at least one second chamber 43, and a refrigeration device 90. The container 80 may include an accommodating space 810. The at least one first chamber 33 and the at least one second chamber 43 may be disposed within the accommodating space 810.

In some embodiments, the superconducting magnet 200 may include magnetic coils 10. In some embodiments, the magnet coils 10 may include a plurality of coil groups. Each of the plurality of coil groups may be wound, e.g., along the circumferential direction of the superconducting magnet 200, around the central axis 260 into a spiral with a cylindrical shape. A coil may spirally extend along the central axis 260. In some embodiments, the plurality of coil groups may be around and centered on the central axis 260. In some embodiments, the plurality of coil groups may be spatially separated from each other.

In some embodiments, the plurality of coil groups may include at least one group of outer coils 110 and at least one group of inner coils 120. In some embodiments, the at least one first chamber 33 may house the at least one group of inner coils 120 (also referred to as field coils). The at least one group of inner coils 120 may be configured to generate a main magnetic field for spin magnetization of an object (e.g., the object 105). The at least one second chamber 43 may house the at least one group of outer coils 110 (also referred to as shield coils). The at least one group of outer coils 110 may be configured to generate a shield magnetic field to cancel out a magnetic field that leaks outside the at least one group of inner coils 120. In some embodiments, the shield magnetic field may be opposite to the main magnetic field.

In some embodiments, the at least one group of inner coils 120 may be located closer to the central axis 260 than the at least one group of outer coils 110. The diameter of the cylinder formed by the at least one group of outer coils 110 may be greater than the diameter of the cylinder formed by the at least one group of inner coils 120. The at least one group of outer coils 110 may surround the periphery of the at least one group of inner coils 120.

In some embodiments, the at least one first chamber 33 and the at least one second chamber 43 may be in fluid communication with each other. The at least one first chamber 33 and the at least one second chamber 43 may be configured to be filled with a cooling medium. The cooling medium may be configured to cool the magnetic coils 10 to or maintain the magnetic coils 10 at a superconducting state. In some embodiments, the cooling medium may include liquid helium. In some embodiments, there may be a gap between the at least one group of inner coils 120 and the at least one first chamber 33, and/or the at least one group of outer coils 110 and the at least one second chamber 43. The gap may be configured to be filled with the cooling medium. The volume of the cooling medium filled into the accommodate space 810 to cool the magnet coils 10 may be larger than the volume of the cooling medium filled into the at least one first chamber 33 and the at least one second chamber 43 to cool the magnet coils 10.

In some embodiments, the refrigeration device 90 may be configured to cool the cooling medium. The refrigeration device 90 may be thermally coupled with the at least one first chamber 33 and/or the at least one second chamber 43. The refrigeration device 90 may be disposed on the container 80. At least a portion of the refrigeration device 90 may be located outside the accommodating space 810. In some embodiments, a cold head 60 of the refrigeration device 90 may extend into the accommodating space 810 and be thermally coupled with the at least one first chamber 33 and/or the at least one second chamber 43.

In some embodiments, the superconducting magnet 200 may include at least one support structure disposed within the accommodating space 810. The magnet coils 10 may be disposed on the at least one support structure. The at least one first chamber 33 and/or the at least one second chamber 43 may be formed based on the at least one support structure. In some embodiments, the at least one support structure may be a cylinder sleeve (e.g., a bobbin) around and centered on the central axis 260. The magnet coils 10 may be wound, e.g., along the circumferential direction of the support structure, around the support structure into a spiral with a cylindrical shape. For example, the magnet coils 10 may be disposed along the inner or outer cylinder surface of the at least one support structure. The inner cylinder surface of the at least one support structure may be closer to the central axis 260 than the outer cylinder surface of the at least one support structure.

Figure 3:
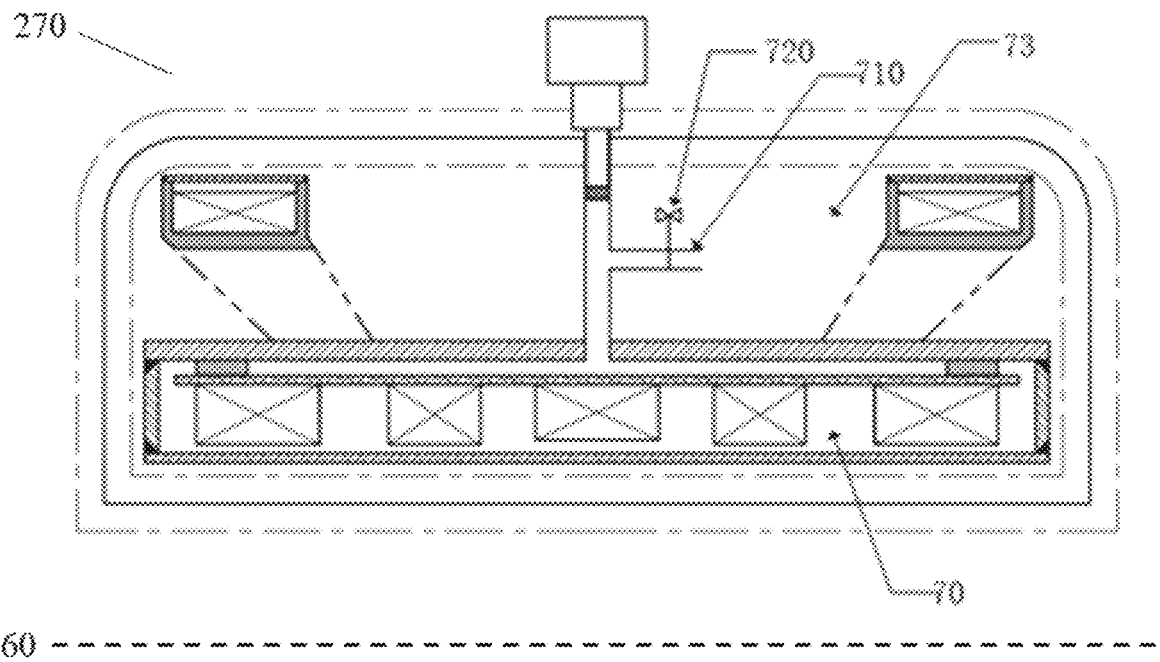
Figure 3:
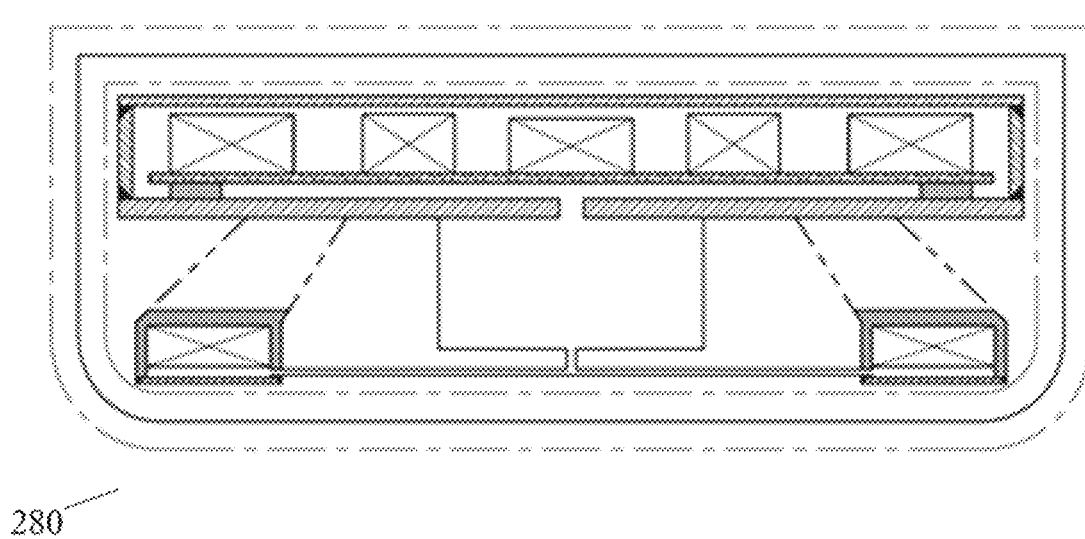
Figure 5:
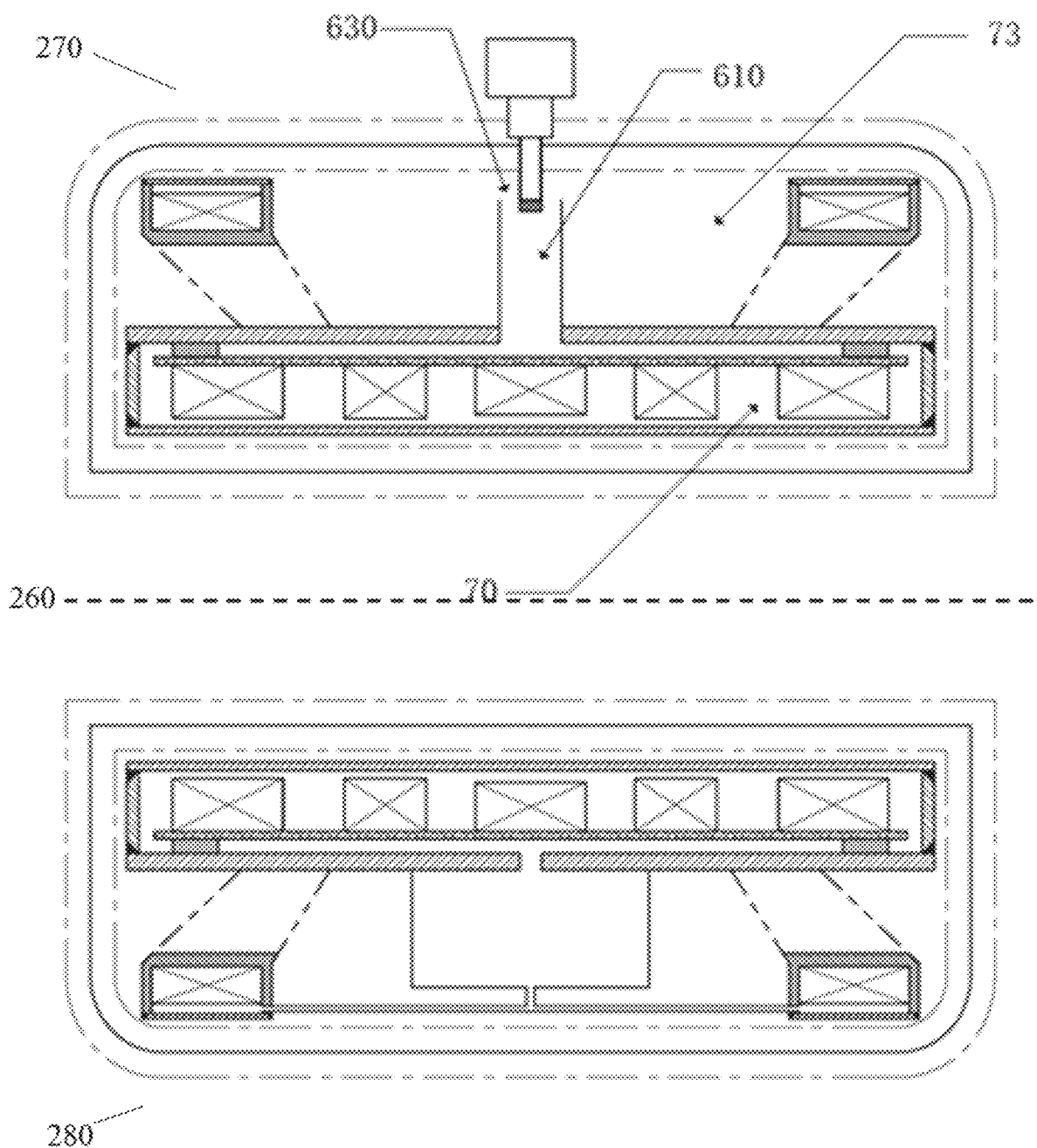

In some embodiments, the at least one first chamber 33 and the at least one second chamber 43 may be in fluid communication with each other so that a cooling chamber 70 (e.g., as shown in FIGS. 3 and 5) may be formed based on the at least one first chamber 33 and the at least one second chamber 43. The cooling chamber 70 may be filled with the cooling medium so that the magnet coils 10 are immersed in the cooling medium to be uniformly cooled, thereby leading to a satisfactory cooling effect of the magnet coils 10. The superconducting magnet 200 may make the entire magnet coils 10 be uniformly cooled, and avoid using the refrigeration device 90 to directly cool the magnet coils 10 or the at least one support structure, thereby in turn avoiding the influence of thermal disturbance.

In some embodiments, the sizes and shapes of the at least one first chamber 33 and the at least one second chamber 43 may be configured according to actual needs. For example, the sizes and shapes of the at least one first chamber 33 and the at least one second chamber 43 may be configured according to the size and shape of the magnet coils 10 and/or the at least one support structure to reduce the gap between the cooling chamber 70 and the magnet coils 10, and make the magnet coils 10 be immersed in the cooling medium. The at least one first chamber 33 and the at least one second chamber 43 may reduce the consumption of the cooling medium, avoid using a large amount of the cooling medium to cool the magnet coils 10 by immersing the magnet coils 10 therein, thereby in turn reducing the cost. By adjusting the volumes of the at least one first chamber 33 and the at least one second chamber 43, the amount of the cooling medium used to cool the magnet coils 10 may be adjusted, thereby achieving the goal of using a smaller amount of the cooling medium to immerse the magnet coils 10. The application of the superconducting magnet 200 in an MRI system (e.g., the MRI system 100) may exemplified above is for illustration purposes, and not intended to be limiting. The system disclosed herein is applicable different types of MRI sequences in the MRI system.

In some embodiments, the superconducting magnet 200 may include at least one third chamber 50 disposed within the accommodating space 810. The at least one first chamber 33 and the at least one second chamber 43 may be in fluid communication with each other through the at least one third chamber 50. In some embodiments, the refrigeration device 90 may be thermally coupled with at least one of the at least one first chamber 33, the at least one second chamber 43, or the at least one third chamber 50.

In some embodiments, the at least one third chamber 50 may house at least one coil superconducting joint, at least one superconducting switch, at least one low-temperature electronic device of the superconducting magnet 200, or the like, or any combination thereof. In some embodiments, a coil group may include a plurality of coil segments. The coil superconducting joint may be used to connect the plurality of coil segments and keep the superconducting performance of the connection of the plurality of coil segments.

In some embodiments, the cooling chamber 70 may be formed based on the at least one first chamber 33, the at least one second chamber 43, and the at least one third chamber 50. The cooling chamber 70 may house the magnet coils 10, and at least one of the at least one coil superconducting joint, the at least one superconducting switch, and the at least one low-temperature electronic device of the superconducting magnet 200.

In some embodiments, the sizes and shapes of the at least one first chamber 33, the at least one second chamber 43, and the at least one third chamber 50 may be configured according to actual needs. For example, the sizes and shapes of the at least one first chamber 33, the at least one second chamber 43, and the at least one third chamber 50 may be configured according to the size and shape of the magnet coils 10 and/or the at least one support structure to reduce the gap between the wall(s) of the cooling chamber 70 and the magnet coils 10, and make the magnet coils 10 be immersed in the cooling medium. For example, the sizes and shapes of the at least one first chamber 33, the at least one second chamber 43, and the at least one third chamber 50 may be configured to make the volume of the cooling chamber 70 within a range of 10 L-300 L. The at least one first chamber 33, the at least one second chamber 43, and the at least one third chamber 50 may reduce the consumption of the cooling medium, avoid using a large amount of the cooling medium to immerse the magnet coils 10, thereby in turn reducing the cost. By adjusting the volumes of the at least one first chamber 33, the at least one second chamber 43, and the at least one third chamber 50, the amount of the cooling medium used to cool the magnet coils 10 may be adjusted, thereby achieving the goal of using a smaller amount of the cooling medium to immerse the magnet coils 10. The application of the superconducting magnet 200 in an MRI system (e.g., the MRI system 100) may exemplified above is for illustration purposes, and not intended to be limiting. The system disclosed herein is applicable different types of MRI sequences in the MRI system.

In some embodiments, the superconducting magnet 200 may include an intermediate support structure 220, a first sealing structure 320, an inner support structure 230, and a plate structure 310.

In some embodiments, the inner support structure 230 may be disposed within the accommodate space 810. The inner support structure 230 may be disposed within the at least one first chamber 33. In some embodiments, the at least one group of inner coils 120 may be disposed on the inner support structure 230. In some embodiments, the intermediate support structure 220 may be disposed within the accommodating space 810. The intermediate support structure 220 may be located farther away from the central axis 260 than the inner support structure 230.

In some embodiments, the first sealing structure 320 may be disposed within the accommodating space 810. The first sealing structure 320 may be located closer to the central axis 260 than the inner support structure 230. In some embodiments, the first sealing structure 320 may be a cylinder sleeve around and centered on the central axis 260.

In some embodiments, the plate structure 310 may be disposed between the first sealing structure 320 and the intermediate support structure 220. In some embodiments, the plate structure 310 may include two annular plates around and centered on the central axis 260. The two annular plates may be respectively located at two ends, along the central axis 260, of the first sealing structure 320 and/or the intermediate support structure 220. In some embodiments, the at least one first chamber 33 may be formed based on the intermediate support structure 220, the first sealing structure 320, and the plate structure 310.

In some embodiments, the at least one group of inner coils 120 may be formed by winding a superconducting wire on a mold of a specific size and pouring resin. A group of inner coils 120 may form a cylinder. The outer cylindrical surface of the at least one group of inner coils 120 may be assembled to the inner cylindrical surface of the inner support structure 230. By pouring resin glue between the at least one group of inner coils 120 and the inner support structure 230, a tight and stable connection may be formed between the at least one group of inner coils 120 and the inner support structure 230. In some embodiments, the plate structure 310 may be disposed at both ends, along the central axis 260, of the intermediate support structure 220. The plate structure 310 may be disposed at each of both ends, along the central axis 260, of the first sealing structure 320. The plate structure 310 may be in physical connection with the first sealing structure 320 and the intermediate support structure 220. The at least one first chamber 33 may accommodate the at least one group of inner coils 120 and at least one coil superconducting joint of the at least one group of inner coils 120. When the at least one first chamber 33 is filled with the cooling medium, the at least one group of inner coils 120 may be immersed in the cooling medium to achieve uniform cooling of the at least one group of inner coils 120.

In some embodiments, the intermediate support structure 220 or the inner support structure 230 may include a metal material, such as an aluminum alloy or stainless steel, which may facilitate processing, assembly, welding and sealing of the intermediate support structure 220 and the inner support structure 230. Alternatively, the intermediate support structure 220 or the inner support structure 230 may include epoxy resin. The intermediate support structure 220 and the inner support structure 230 may be connected to other components through bonding. In some embodiments, on the premise of ensuring the structural strength of the superconducting magnet 200, the size of the first sealing structure 320 and the plate structure 310 may be set relatively small to reduce a gap between the plate structure 310 and the container 80, and a gap between the plate structure 310 and the at least one group of inner coils 120, thereby saving costs by reducing the volume of the cooling medium.

In some embodiments, the intermediate support structure 220, the inner support structure 230, and the first sealing structure 320 may be cylinder sleeves centered on the central axis 260. In some embodiments, in order to avoid the leak of the cooling medium from the first chamber 33 to the accommodate space 810, a sealed connection among the plate structure 310, the intermediate support structure 220, and the first sealing structure 320 may be achieved. The circumferential edge of the plate structure 310 may be in sealed connection with the circumferential edges of the intermediate support structure 220 and the first sealing structure 320, which avoid or alleviate the difficulty of welding corners of the at least one first chamber 33. The sealed connection at the circumferential edges of the intermediate support structure 220, the inner support structure 230, and the first sealing structure 320 may make the strength of the connection uniform, which solves the problem of stress concentration and facilitate the assembly and installation of the at least one first chamber 33.

In some embodiments, the superconducting magnet 200 may include at least one connection component 250 disposed between the inner support structure 230 and the intermediate support structure 220. Through the at least one connection component 250, the inner support structure 230 may be connected to the intermediate support structure 220. The at least one connection component 250 may allow the connection between the inner support structure 230 and the intermediate support structure 220 to have sufficient strength to resist the electromagnetic force exerted on the magnet coils 10. In some embodiments, the at least one connection component 250 may be evenly distributed between the inner support structure 230 and the intermediate support structure 220 so as to ensure the uniformity of the magnetic field generated by the superconducting magnet 200. In some embodiments, the material of the at least one connection component 250 may include a material that resists the shrinkage interference performance.

In some embodiments, the at least one connection component 250 may be disposed a certain distance away from the connection position between the intermediate support structure 220 and the plate structure 310, so as to reduce the influence of welding deformation and assembly errors.

In some embodiments, the inner support structure 230 may be omitted in the superconducting magnet 200. In this case, the at least one group of inner coils 120 may be disposed on the intermediate support structure 220 or the first sealing structure 320, which may fully use the space of the at least one first chamber 33 and reduce costs. In some embodiments, the at least one group of inner coils 120 may be disposed on the inner cylindrical surface of the intermediate support structure 220 or the outer cylindrical surface of the first sealing structure 320.

In some embodiments, the superconducting magnet 200 may include an outer support structure 210 and a second sealing structure 410. The outer support structure 210 may be disposed in the accommodating space 810. The at least one group of outer coils 110 may be disposed on the outer support structure 210. The outer support structure 210 may be located farther away from the central axis 260 than the intermediate support structure 220. The second sealing structure 410 may be disposed in the accommodating space 810. The second sealing structure 410 may be located farther away from the outer support structure 210. In some embodiments, the second sealing structure 410 may be in physical connection with the outer support structure 210. The at least one second chamber 43 may be formed based on the outer support structure 210 and the second sealing structure 410.

In some embodiments, the outer support structure 210 and the second sealing structure 410 may both be cylinder sleeves around and centered on the central axis 260. In some embodiments, the at least one group of outer coils 110 may be disposed on the outer cylinder surface of the outer support structure 210. The second sealing structure 410 may be disposed around the periphery of the at least one group of outer coils 110.

In some embodiments, the outer support structure 210 may include a groove around and centered on the central axis 260. The at least one group of outer coils 110 may be disposed in the groove. In some embodiments, the outer support structure 210 and the second sealing structure 410 may be connected by two wire groove flanges 420. In some embodiments, the at least one second chamber 43 may be formed based on the second sealing structure 410, the two wire groove flanges 420, and the outer support structure 210. The at least one second chamber 43 may accommodate the at least one group of outer coils 110 and at least one coil superconducting joint of the at least one group of outer coils 110. When the at least one second chamber 43 is filled with the cooling medium, the at least one group of outer coils 110 may be immersed in the cooling medium to achieve uniform cooling of the at least one group of outer coils 110.

In some embodiments, the outer support structure 210 or the second sealing structure 410 may include a metal material, such as an aluminum alloy or stainless steel, which may facilitate the processing, assembly, welding and sealing of the outer support structure 210 and the second sealing structure 410. Alternatively, the outer support structure 210 or the second sealing structure 410 may include epoxy resin. The outer support structure 210 and the second sealing structure 410 may be connected to other components through bonding by, e.g., a bonding agent. In some embodiments, on the premise of ensuring the structural strength of the superconducting magnet 200, the size of the second sealing structure 410 may be set relatively small to reduce a gap between the second sealing structure 410 and the at least one group of outer coils 110, thereby saving costs by reducing the volume of the cooling medium. The outer support structure 210 and the second sealing structure 410 may be connected by the two wire groove flanges 420, which may solve the difficulty of welding corners of the at least one second chamber 43 and facilitate the assembly and installation of the at least one second chamber 43.

In some embodiments, the welding connection between the second sealing structure 410 and the two wire groove flanges 420 may be located a certain distance away from the at least one group of outer coils 110 to reduce the influence of welding deformation and assembly errors.

In some embodiments, the outer support structure 210 and the intermediate support structure 220 may be in physical connection through a bracket 240. The bracket 240 may be disposed between the outer support structure 210 and the intermediate support structure 220. The bracket 240, the outer support structure 210, and the intermediate support structure 220 may be coaxial with each other with respect to the central axis 260 and centered on the central axis 260 so as to ensure the uniformity of the magnetic field generated by the superconducting magnet 200. In some embodiments, the bracket 240 may allow the connection between the outer support structure 210 and the intermediate support structure 220 to have sufficient strength to resist the electromagnetic force exerted on the magnet coils 10. In some embodiments, the material of the bracket 240 may include a material that resists the shrinkage interference performance.

In some embodiment, the at least one first chamber 33 and the at least one third chamber 50 may be in fluid communication through a first connection hole 510 disposed between the at least one first chamber 33 and the at least one third chamber 50. In some embodiments, the first connection hole 510 may allow at least one superconducting connecting wires of the at least one group of inner coils 120 to pass between the at least one first chamber 33 and the at least one third chamber 50.

In some embodiments, the at least one third chamber 50 and the at least one second chamber 43 may be in fluid communication through a first connection passage 440 and a second connection hole 520. In some embodiments, the second connection hole 520 may be disposed between the at least one third chamber 50 and the first connection passage 440 to achieve the fluid communication between the at least one third chamber 50 and the at least one second chamber 43. In some embodiments, the first connection passage 440 may allow at least one superconducting connecting wires of the at least one group of outer coils 110 to pass between the at least one second chamber 43 and the at least one third chamber 50. When the at least one first chamber 33, the at least one second chamber 43, the at least one third chamber 50, the first connection hole 510, the second connection hole 520, and the first connection passage 440 are filled with the cooling medium, the magnet coils 10, at least one coil superconducting joint of the magnet coils 10, at least one superconducting switch, and at least one low-temperature electronic device may be immersed in the cooling medium to achieve uniform cooling.

In some embodiments, the at least one third chamber 50 may be located farther away from the central axis 260 than the intermediate support structure 220. In this way, less space of the accommodating space 810 may be occupied by the at least one third chamber 50. In some embodiments, the at least one third chamber 50 may be disposed at a position where the magnetic field generated by the magnet coils 10 is relatively weak, which may avoid or reduce the interference by the at least one third chamber 50 on the magnetic field generated by the magnet coils 10.

In some embodiment, the refrigeration device 90 may be thermally coupled with at least one of the at least one first chamber 33, the at least one of the second chamber 43, and the at least one third chamber 50. In some embodiments, the refrigeration device 90 may be used to perform reflux condensation on the cooling medium.

In some embodiments, the cold head 60 of the refrigeration device 90 may extend to the accommodating space 810, and be thermally coupled with at least one of the at least one first chamber 33, the at least one of the second chamber 43, and the at least one third chamber 50 through a second connection passage 610 and a third connection hole 620 to form a reflux condensation channel for the cooling medium. In some embodiments, the cooling chamber 70 may be formed based on the cold head 60, the at least one first chamber 33, the at least one second chamber 43, and the at least one third chamber 50 through several connection holes and connection passages, e.g., the first connection hole 510, the second connection hole 520, the third connection hole 620, the first connection passage 440, and the second connection passage 610. During an operation for cooling the magnet coils 10 using the cooling medium, when part of the cooling medium (e.g., liquid helium) vaporizes into gas (e.g., gaseous helium), the gas may flow along the second connection passage 610 from the cooling chamber 70 to the cold head 60 and be cooled into liquid by the cold head 60. The liquid cooling medium may flow back to the cooling chamber 70 along the second connection passage 610. In some embodiments, in a process of quenching of superconductivity of the magnet coils 10, the magnet coils 10 may change from the superconducting state to the normal conducting state, and release heat. The cooling medium in the cooling chamber 70 may absorb the released heat and vaporize into gas, increasing the pressure of the cooling chamber 70 by, e.g., several megapascals. The cold head 60 may cool the gaseous cooling medium to remove the increased pressure.

In some embodiments, as shown in FIG. 3, the cooling chamber 70 may be formed based on the at least one first chamber 33, the at least one second chamber 43, and the at least one third chamber 50. An outer chamber 73 may be formed based on the outer wall of the cooling chamber 70 and the inner wall of the container 80. The accommodating space 810 may be formed based on the inner wall of the container 80. The refrigeration device 90 and the at least one first chamber 33 may be connected through the second connection passage 610. In some embodiments, the superconducting magnet 200 may include an exhaust passage 710 and a control valve 720. The exhaust passage 710 may be disposed on the second connection passage 610. The control valve 720 may be disposed on the exhaust passage 710 to control a fluid communication between the outer chamber 73 and the cooling chamber 70.

In some embodiments, with the exhaust passage 710 and the second connection passage 610, the fluid communication between the cooling chamber 70 and the outer chamber 73 may be achieved. In some embodiments, when the pressure in the cooling chamber 70 is higher than a pressure threshold (e.g., a pressure in the cooling chamber 70 when the cooling medium in the cooling chamber 70 maintains the superconducting state), the control valve 720 may be caused to allow the fluid communication between the cooling chamber 70 and the outer chamber 73 to release the pressure in the cooling chamber 70. For example, in the process of quenching of superconductivity of the magnet coils 10, the control valve 720 may be caused to allow a fluid communication between the cooling chamber 70 and the outer chamber 73 to release the gaseous cooling medium in the cooling chamber 70 to the outer chamber 73.

Due to the relatively large volume of the outer chamber 73, the gaseous cooling medium may be released to the container 80 through the exhaust passage 710 and the control valve 720, thereby avoiding or reducing a pressure buildup the cooling chamber 70 in the process of quenching of superconductivity of the magnet coils 10.

Figure 4:
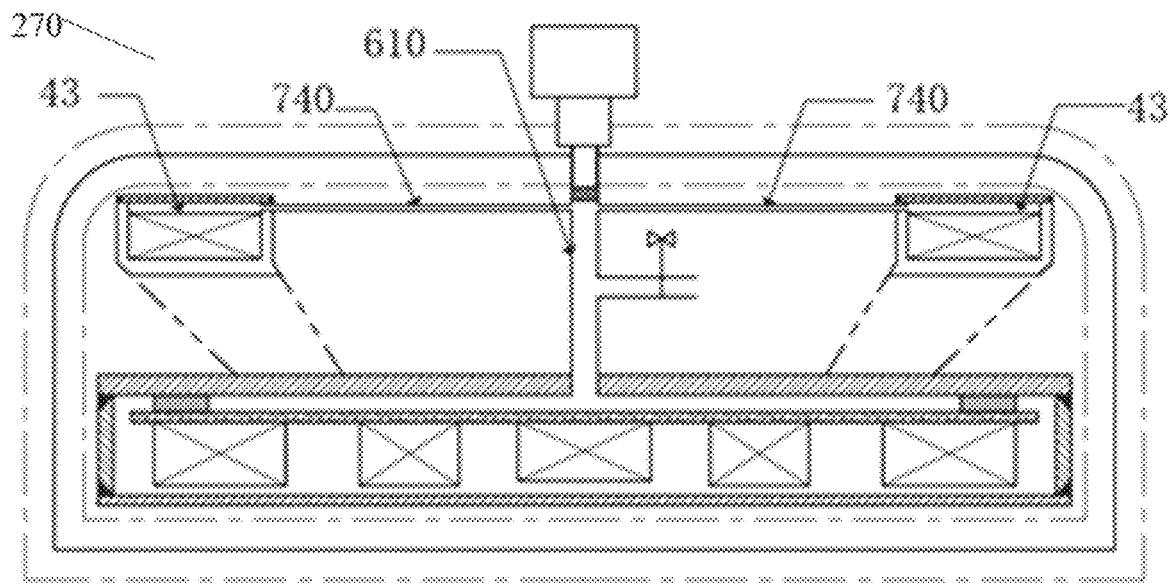
Figure 4:
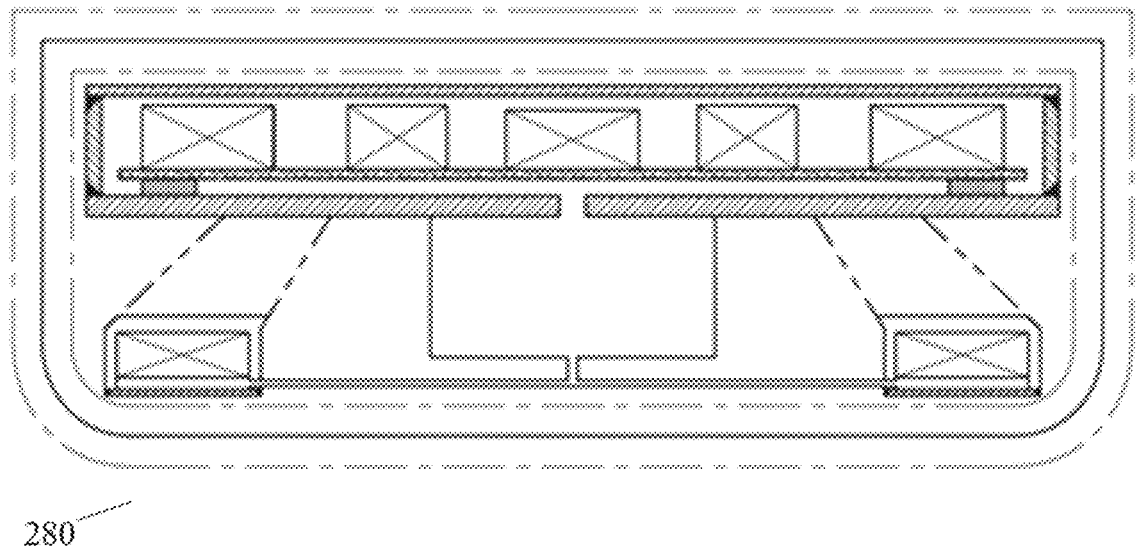

In some embodiments, as shown in FIG. 4, the superconducting magnet 200 may include a third connection passage 740. The third connection passage 740 may be in fluid communication with the second connection passage 610 and the at least one second chamber 43, facilitating the circulation of the cooling medium in the cooling chamber 70, thereby in turn achieving a better cooling effect of the magnet coils 10.

In some embodiments, as shown in FIG. 5, the refrigeration device 90 and the cooling chamber 70 may be fluidly connected through the second connection passage 610 including at least one opening 630. The cooling chamber 70 may be in fluid communication with the outer chamber 73 through the at least one opening 630.

The gaseous cooling medium may directly enter the outer chamber 73 (i.e., the accommodating space 810 of the container 80). The gaseous cooling medium may be condensed by the cold head 60 and return back to the cooling chamber 70 through the second connection passage 610. In order to release the pressure of the cooling chamber 70, the installation and operation for the second connection passage 610 with the at least one opening 630 may be simpler than that for the second connection passage 610 with the exhaust passage 710 and the control valve 720.

When the cooling medium is liquid helium, if a relatively small amount of liquid helium is filled into the cooling chamber 70, most of the liquid helium may evaporate during a long-distance transportation of the superconducting magnet 200. The temperature of the magnet coils 10 may increase, turning the magnet coils 10 from the superconducting state to the normal conducting state. Then, the magnet coils 10 may need to be cooled again. Therefore, besides the liquid helium filled into the cooling chamber 70, the outer chamber 73 may be filled with liquid helium to reduce the evaporation of the liquid helium in the cooling chamber 70.

In some embodiments, the outer chamber 73 may also be filled with a certain amount of a cooling medium having a high heat capacity (or referred to as a high heat capacity medium), such as liquid nitrogen or water. When the superconducting magnet 200 is cooled, the high heat capacity medium may be cooled to a solid. When the superconducting magnet 200 is transported, the solid high heat capacity medium may absorb heat from the superconducting magnet 200, thereby greatly prolonging the acceptable transportation time. The high heat capacity medium may also absorb the heat generated by the quenching of superconductivity of the superconducting magnet 200, thereby slowing down the temperature rise of the magnet coils 10 and shortening the time of re-cooling the superconducting magnet 200.

In some embodiments, the container 80 may include an inner container 820, an intermediate heat shield 830, and an outer vacuum container 840. In some embodiments, the container 80 may be a cryostat. The inner container 820, the intermediate heat shield 830, and the outer vacuum container 840 may be coaxial with respect to the central axis 260 and centered on the central axis 260.

In some embodiments, the cooling chamber 70 may be formed based on the at least one first chamber 33, the at least one second chamber 43, the at least one third chamber 50, and at least one connection structure (e.g., at least one of the first connection hole 510, the second connection hole 520, the first connection passage 440, the third connection hole 620, the second connection passage 610, and the third connection passage 740). The cooling chamber 70 may be filled with the cooling medium to uniformly cool the magnet coils 10, the coil superconducting joints, the superconducting switches, and the low-temperature electronic devices. In some embodiments, the container 80 may include the intermediate heat shield 830 and the outer vacuum container 840, and not include the inner container 820, so that the container 80 has a more simple structure, thereby saving costs.

In some embodiments, an MRI system (e.g., the MRI system 100 in FIG. 1A) may include the superconducting magnet 200 provided in the present disclosure. Through the superconducting magnet 200, the magnet coils 10, the coil superconducting joints, the superconducting switches, and the low-temperature electronic devices may be uniformly cooled, so that the superconducting magnet 200 maintains good magnetic field stability, thereby improving the image quality of images generated by the MRI system.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

The present disclosure provides a superconducting magnet system. The superconducting magnet system may be applied in an MRI system (e.g., the MRI system 100).

Figure 6:
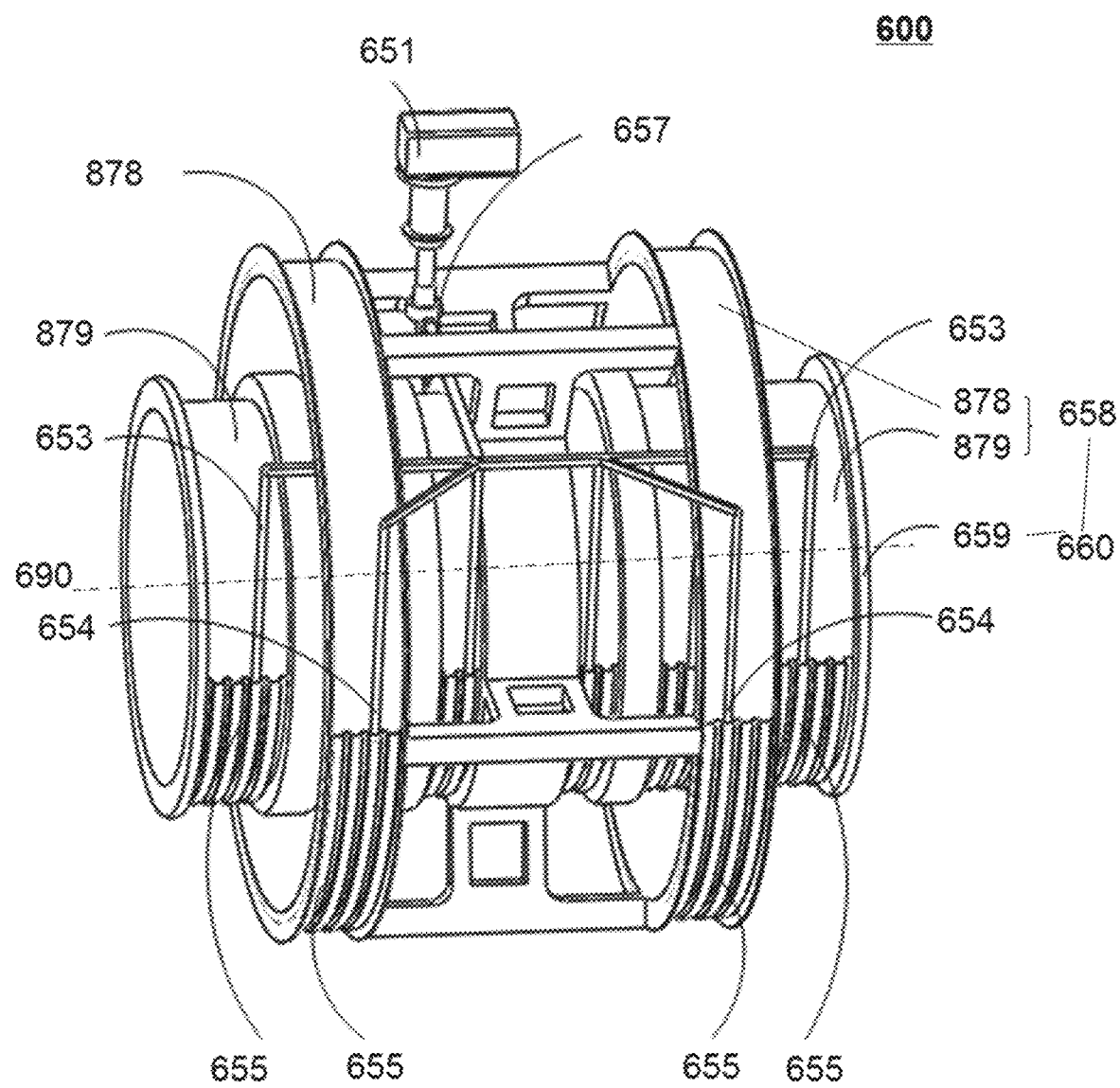
FIG. 6 is a schematic block diagram illustrating an exemplary superconducting magnet system according to some embodiments of the present disclosure.
Figure 7:
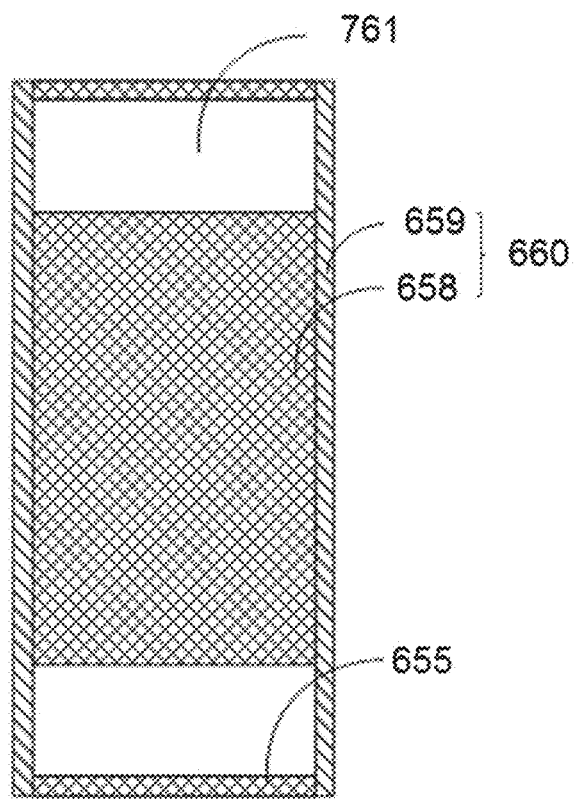
FIG. 7 is a schematic block diagram illustrating a cross-section of a chamber of an exemplary superconducting magnet system according to some embodiments of the present disclosure.

Merely by way of example, FIG. 6 is a schematic block diagram illustrating an exemplary superconducting magnet system according to some embodiments of the present disclosure. FIG. 7 is a schematic block diagram illustrating a cross-section of a chamber of an exemplary superconducting magnet system according to some embodiments of the present disclosure.

In some embodiments, as shown in FIGS. 6-7, a superconducting magnet system 600 may include a superconducting magnet 660 including a support structure 659 and magnet coils 658 disposed on the support structure 659.

In some embodiments, the support structure 659 may be a cylinder sleeve (e.g., a bobbin) around and centered on a central axis 690 of the superconducting magnet system 600. When the superconducting magnet system 600 is used (e.g., installed) in the MRI system 100, the central axis may be parallel to the Z axis in FIG. 1A. In some embodiments, the magnet coils 568 may include a plurality of coil groups. Each of the plurality of coil groups may be wound, e.g., along the circumferential direction of the support structure 659, around the support structure 659 into a spiral with a cylindrical shape. A coil may spirally may extend along the central axis 690. For example, one of the plurality of coil groups may be disposed along the inner or outer cylinder surface of the support structure 659. The inner cylinder surface of the support structure 659 may be closer to the central axis 690 than the outer cylinder surface of the support structure 659. In some embodiments, the plurality of coil groups may be around and centered on the central axis 690. In some embodiments, the plurality of coil groups may be spatially separated from each other.

In some embodiments, the magnet coils 658 may include at least one group of inner coils 879 (also referred to as field coils) and at least one group of outer coil 878 (also referred to as shield coils). The at least one group of inner coils 879 may be configured to generate a main magnetic field for spin magnetization of an object (e.g., the object 105). The at least one group of outer coils 878 may be configured to generate a shield magnetic field to cancel out a magnetic field that leaks outside the at least one group of inner coils 879. In some embodiments, the shield magnetic field may be opposite to the main magnetic field.

In some embodiments, the at least one group of inner coils 879 and the at least one group of outer coils 878 may be around and centered on the central axis 690. The at least one group of outer coils 878 may surround the periphery of the at least one group of inner coils 879. The at least one group of inner coils 879 may be located closer to the central axis 690 than the at least one group of outer coils 878. The radius of the cylinder formed by the at least one group of inner coils 879 may be smaller than the radius of the cylinder formed by the at least one group of outer coils 878.

In some embodiments, the superconducting magnet system 600 may include at least one shell structure 655 disposed around the magnet coils 658. At least one chamber 761 (e.g., as shown in FIG. 7) may be formed based on the support structure 659 and the at least one shell structure 655. The at least one chamber 761 may be configured to be filled with a cooling medium. The cooling medium may be configured to cool the magnet coils 658 to or maintain the magnetic coils 658 at a superconducting state. At least a portion of the magnet coils 658 may be in thermal contact with the cooling medium.

In some embodiments, the superconducting magnet system 600 may include a refrigeration device 651 configured to cool the cooling medium. The refrigeration device 651 may be disposed outside the magnet coils 658. The refrigeration device 651 may cool the cooling medium by heat transfer to make the cooling medium change from liquid to solid.

In some embodiments, the superconducting magnet system 600 may include the superconducting magnet 660 including the support structure 659 and the magnet coils 658 disposed on the support structure 659. The superconducting magnet system 600 may include the at least one shell structure 655 disposed around the magnet coils 658. The superconducting magnet system 600 may include at least one thermal conduction structure 653. The magnet coils 658 may include at least one group of field coils 879 and at least group of shield coils 878. The radius of the cylinder formed by the at least one group of shield coils 878 may be larger than the radius of the cylinder formed by the at least one group of field coils 879. The at least one shell structure 655 may be around the periphery of the magnet coils 658. The at least one chamber 761 may be formed based on the at least one shell structure 655, and the support structure 659 or the magnet coils 658. The at least one chamber 761 may be filled with the cooling medium. Before filled into the at least one chamber 761, the cooling medium may be in a liquid state. After filled into the at least one chamber 761, the liquid cooling medium may transform to a solid state through heat transfer of the refrigeration device 651 to cool the magnet coils 658. In some embodiments, the solid cooling medium may be in thermal contact with at least a portion of the magnet coils 658 to cool the magnet coils 658.

In some embodiments, a thermal conduction structure 653 may include a first end 654 and a second end 657. The first end 654 may be thermally coupled with the cooling medium. The second end 657 may be thermally coupled with the refrigeration device 651 to facilitate heat transfer between the refrigeration device 651 and the cooling medium to cool the cooling medium. For example, the first end 654 of the thermal conduction structure 653 may be immersed in the cooling medium to cool the cooling medium. As another example, the first end 654 of the thermal conduction structure 653 may be thermally connected to a shell structure 655 to facilitate heat transfer between the refrigeration device 651 and the shell structure 655. The shell structure 655 may cool the cooling medium by heat transfer, that is, the thermal conduction structure 653 may indirectly cool the cooling medium through the shell structure 655.

In some embodiments, the at least one shell structure 655 may surround a portion or all of the outer circumference of the magnet coils 658. The portion surrounded by the at least one shell structure 655 may be closer to the floor (on which the MRI system 100 is supported) than the portion not surrounded by the at least one shell structure 655. The at least one chamber 761 may be formed based on the gap between the at least one shell structure 655 and the magnet coils 658. In some embodiments, the at least one chamber 761 may be in thermal communication with each other. In some embodiments, the at least one shell structure 655 and the support structure 659 may be in sealed connection so that the at least one chamber 761 is able to hold the liquid cooling medium. In some embodiments, the at least one chamber 761 may be of any shape. The shape of the at least one chamber 761 may depend on the shape of the at least one shell structure 655. The size of the at least one chamber 761 may depend on the size of the gap between the at least one shell structure 655 and the magnet coils 658. In some embodiments, the shape and size of the at least one chamber 761 may relate to the size of the magnet coils 658 and/or the time and cost required to cool the magnet coils 658 to a superconducting state. In some embodiments, the volume of the cooling medium may increase after the cooling medium changes from liquid to solid. Therefore, a cooling medium with a volume smaller than the volume of the at least one chamber 761 may be filled into the at least one chamber 761 to prevent the solid cooling medium from expanding out of the at least one chamber 761.

In some embodiments, the liquid cooling medium with an initial temperature (e.g., 0-25° C.) may be filled into the at least one chamber 761 to be cooled to cool the magnet coils 658. The liquid cooling medium may have fluidity and be evenly distributed in the at least one chamber 761, that is, the liquid cooling medium in the at least one chamber 761 may uniformly surround part or all of the magnet coils 658. By cooling of the liquid cooling medium, the temperature of the cooling medium may decrease, and the cooling medium may be solidified, such as frozen. The solidified cooling medium may be served as a heat-transfer network, which may uniformly surround part or all of the magnet coils 658, thereby forming a good thermal contact between the magnet coils 658 and the cooling medium. In some embodiments, the cooling rate of the cooling medium may be controlled so that there is a good thermal contact between the at least one thermal conduction structure 653 immersed in the cooling medium and the solidified cooling medium. Therefore, due to the cooling medium's own physical characteristics, the cooling medium may have good performance in heat transfer after solidification, so that the localized heating of the superconducting magnet 660 may be avoided, thereby reducing the risk of quenching of superconductivity of the superconducting magnet system 600.

In some embodiments, the corresponding relation between the at least one chamber 761 and the at least one thermal conduction structure 653 may not be limited in the present disclosure. In some embodiments, the plurality of coil groups may be far away from the refrigeration device 651. Each of the at least one chamber 761 may correspond to one of the at least one thermal conduction structure 653. A thermal conduction structure 653 corresponding to one of the at least one chamber 761 may be fastened in the solidified cooling medium in the chamber 761 or in thermal connection with at least one corresponding shell structure 655, thereby improving the efficiency of the heat transfer to the magnet coils 658. In some embodiments, two or more chambers 761 may correspond to one of the at least one thermal conduction structure 653. For example, considering the cost and the efficiency of the heat transfer, two or more chambers 761 between which there is a relatively short heat-transferring path may be configured to be in thermal communication with each other. One of the at least one thermal conduction structure 653 may be thermally coupled with one of the two or more thermally communicating chambers 761 to facilitate heat transfer between the refrigeration device 651 and the two or more chambers 761.

In some embodiments, the outer cylinder surface and two opposite sides of each of the plurality of coil groups may be in thermal contact with the solid cooling medium. The cooling medium may alleviate the localized heating on the magnet coils 658, thereby reducing the risk of quenching of superconductivity of the superconducting magnet system 600. The superconducting magnet system 600 may have simple structure and strong stability.

In some embodiments, the corresponding relation of the at least one chamber 761, the at least one coil group, and the at least one shell structure 655 may not be limited in the present disclosure. In some embodiments, the at least one chamber 761, the at least one coil group, and the at least one shell structure 655 may be in one-to-one correspondence. The cooling medium may have a relatively high heat capacity after solidification. It may take a certain time and cooling cost to cool the solidified cooling medium to the liquid helium temperature. Therefore, on the premise that the temperature of the magnet coils 658 is reduced to the liquid helium temperature, the time cost and the cooling cost may be saved by reducing the volume of the cooling medium in the at least one chamber 761. In some embodiments, according to the one-to-one correspondence of the at least one chamber 761, the at least one coil group, and the at least one shell structure 655, the cooling medium filled into the at least one chamber 761 may fully cover the magnet coils 658, thereby improving the utilization rate of the cooling medium and reducing the time cost and cooling cost of cooling the solidified cooling medium to the range liquid helium temperature. As used herein, a cooling cost refers to the consumption of the cooling medium and/or energy (e.g., electric energy) used to cool the cooling medium to or maintain the cooling medium at the liquid helium temperature, and/or cool the magnet coils to or maintain the magnet coils at a superconducting state.

In some embodiments, the correspondence of the at least one chamber 761, the at least one coil group, and the at least one shell structure 655 is not limited to one-to-one correspondence. For example, a chamber 761 may correspond two at least one of the plurality of coil group. Two or more chambers 761 may be formed based on the support structure 659 and one of the at least one shell structure 655 under the premise of satisfying the cooling efficiency to cool the magnet coils 658 to a superconducting state under the premise of satisfying the cooling efficiency to cool the magnet coils 658 to a superconducting state. As another example, one of the at least one chamber 761 may be formed based on the support structure 659 and two or more shell structures 655 under the premise of satisfying the cooling efficiency to cool the magnet coils 658 to or maintain the magnetic coils 658 at a superconducting state. In some embodiments, the corresponding relationship of the at least one chamber 761, the at least one coil group, and the at least one shell structure 655 may be set based on the actual conditions such as device cost, time cost, and cooling cost.

In some embodiments, one of the at least one shell structure 655 may be an arc-shaped sheet structure and extend along the circumference of the magnet coils 658. In some embodiments, the arc-shaped shell structure 655 may cover a part of the circumference of the magnet coils 658 to form at least one open chamber 761, so that the at least one open chamber 761 may be in fluid communication with the space outside the at least one open chamber 761. The open shell structure 655 may avoid squeezing the corresponding chamber 761 caused by the increased volume of the solidified cooling medium. In some embodiments, the open shell structure 655 may facilitate the filling of the cooling medium into the corresponding chamber 761. In some embodiments, the arc-shaped shell structure 655 may cover a part of the circumference of the magnet coils 658 to form at least one chamber 761 with at least one through hole on the shell structure 655 to facilitate the installation of at least one thermal conduction structure 653. After the at least one thermal conduction structure 653 is installed on the shell structure 655, the at least one corresponding chamber 761 may include at least one closed chamber. The closed chamber 761 may prevent the overflow of the cooling medium due to, e.g., vibration or sloping, etc. In some embodiments, the shell structure 655 may be mechanically connected to a portion of the support structure 659 protruding beyond the magnet coils 658 (also referred to as the protruding portion of the support structure 659) to form at least one chamber 761. In some embodiments, the volume of the liquid cooling medium filled in the at least one chamber 761 may be determined by considering the increase of the volume of the cooling medium after solidification such that the solidified cooling medium does not expand beyond the at least one chamber 761. The volume of the liquid cooling medium filled into the at least one chamber 761 may be smaller than the volume of the at least one chamber 761 to reserve space for the increased volume of the solid cooling medium.

In some embodiments, one of the at least one shell structure 655 may be a cylinder structure and may be sleeved around the periphery of the magnet coils 658. In some embodiments, the shell structure 655 may be provided with at least one through hole for the installation of at least one thermal conduction structure 653. The first end 654 the thermal conduction structure 653 may pass through the through hole and enter at least one corresponding chamber 761 to be immersed in the cooling medium. In some embodiments, the shell structure 655 may be mechanically connected to a portion of the support structure 659 protruding beyond the magnet coils 658 (also referred to as the protruding portion of the support structure 659) to form at least one chamber 761. In some embodiments, the shell structure 655 may cover the entire periphery of at least one of the plurality of coil groups. The cooling medium filled into the at least one corresponding chamber 761 may cover the outer circumference of the at least one of the plurality of coil groups, and the temperature reduction efficiency of the magnet coils 658 may be improved. In some embodiments, the volume of the liquid cooling medium filled into the at least one chamber 761 may be determined by considering the increase of the volume of the cooling medium after solidification. The volume of the liquid cooling medium filled into the at least one chamber 761 may be smaller than the volume of the at least one chamber 761 to reserve space for the increased volume of the cooling medium after solidification.

In some embodiments, the at least one shell structure 655 may be concentric with the magnet coils 658 with respect to the central axis 690. In some embodiments, two or more shell structures 655 may be in physical connection along the central axis 690. In some embodiments, two or more shell structures 655 may be in physical connection along the circumferential direction of the magnet coils 658 to form a cylinder structure or a larger arc structure.

In some embodiments, the material of the shell structure 655 may include a metal, and the first end 654 of a thermal conduction structure 653 may be in thermal connection with the shell structure 655. The strength of metal may be relatively high, and metal may be applied to the internal environment of the superconducting magnet system 600. In some embodiments, the material of the shell structure 655 of the present disclosure may a material other than a metal. In some embodiments, the material of the shell structure 655 may include plastic with a relatively high strength. In some embodiments, the connection between the protruding portion of the support structure 659 and the shell structure 655 may depend on the material of the shell structure 655. In some embodiments, heat transfer between the refrigeration device 651 and shell structure 655 may be performed through the thermal conduction structure 653 to cool the shell structure 655, and then heat transfer between the shell structure 655 and the cooling medium may be performed to cool the cooling medium, thereby increasing the contact area for heat transfer to cool the cooling medium.

In some embodiments, the shell structure 655 and the superconducting magnet 660 may be in physical connection by welding or bonding. It should be understood that the present disclosure does not limit the connection manner between the shell structure 655 and the superconducting magnet 660, as long as the connection between the shell structure 655 and the superconducting magnet 660 is stable and the chamber 761 so formed is able to hold the cooling medium. In some embodiments, both sides of the shell structure 655 along the central axis 690 may be in physical connection with the protruding portion of the support structure 659. By welding or bonding the shell structure 655 and the support structure 659, leakage of the cooling medium from the chamber 761 may be avoided, thereby improving the structural integrity of the superconducting magnet system 600.

In some embodiments, the cooling medium may include pure water or ethanol aqueous solution. The pure water may freeze as the temperature decreases. According to physical characteristics of the pure water, the heat transfer rate of ice may reach, in the temperature range of liquid helium, a relatively high value (e.g., larger than 100 W $m^{-1}k^{-1}$). The heat transfer rate of pure water may be at the same level as pure copper. Compared with the heat transfer network formed based on a high-purity copper material, the use of pure water as the cooling medium may have an extremely high advantage in price.

When pure water is used as the cooling medium, first, the pure water may be filled into the at least one chamber 761 of the superconducting magnet system 600, and then, the pure water in the at least one chamber 761 may transform to solid ice by slowly lowering the temperature. After the pure water freezes, the at least one thermal conduction structure 653 pre-immersed in the pure water may be in good thermal contact with the solid ice. The second end 657 of the at least one thermal conduction structure 653 may be thermally coupled with the refrigeration device 651. Through the at least one thermal conduction structure 653 and the solid ice with a relatively high heat transfer rate at a low temperature, an effective heat transfer may be performed between the refrigeration device 651 and the magnet coils 658, thereby cooling the magnet coils 658 to a superconducting state. In some embodiments, the refrigeration device 651 may include a GM refrigerator.

In some embodiments, the cooling medium may include a 30% ethanol aqueous solution. The strength (e.g., the yield strength and/or the tensile strength) of the aqueous ethanol solution at a low temperature may be higher than that pure water, and may depend on the percentage of ethanol in the aqueous ethanol solution. It should be understood that the type of the cooling medium in the present disclosure is not limited to pure water or an ethanol aqueous solution. The cooling medium used in the superconducting magnet system 600 needs to have a relatively high heat transfer rate at low temperature. In some embodiments, different substances may be added to an aqueous solution or pure water to obtain a cooling medium that has a relatively high heat transfer rate at low temperature.

Compared with heat transfer network formed based on a high-purity copper material, heat transfer network formed based on solidification of pure water or an ethanol aqueous solution may have a low cost. This is because the pure water, the ethanol aqueous solution, or other similar liquids may have good fluidity and may be easily obtained. This advantage makes the cost of cooling the magnet coils 658 using such a cooling medium extremely low. Due to the fluidity of liquid, the solidified pure water, ethanol aqueous solution or other similar liquids may evenly cover most of the surface of the magnet coils 658, and form a good thermal contact between the cooling medium and the magnet coils 658, which may alleviate the local heating effect of the magnet coils 658. Due to the high electric conductivity of the metal heat transfer network, it is usually necessary to make a high-grade insulating layer between the metal heat transfer network and the magnet coils 658. The insulating layer may reduce the heat transfer rate of the metal heat transfer network. The heat transfer network formed based on solidification of pure water, ethanol aqueous solution or other similar liquids used in the present disclosure may be inherently insulating, so that the heat transfer network formed after the cooling medium is solidified may be in fully contact with the magnet coils 658 without performing any insulation treatment on the contact surface between the cooling medium and the magnet coils 658, thereby simplifying the structure of the superconducting magnet system 600 and reducing costs.

In some embodiments, a cold head of the refrigeration device 651 may be thermally coupled with the second end 657 of the at least one thermal conduction structure 653. Heat transfer may be performed between the refrigeration device 651 and the magnet coils 658 through the at least one thermal conduction structure 653 to cool the magnet coils 658.

Figure 8:
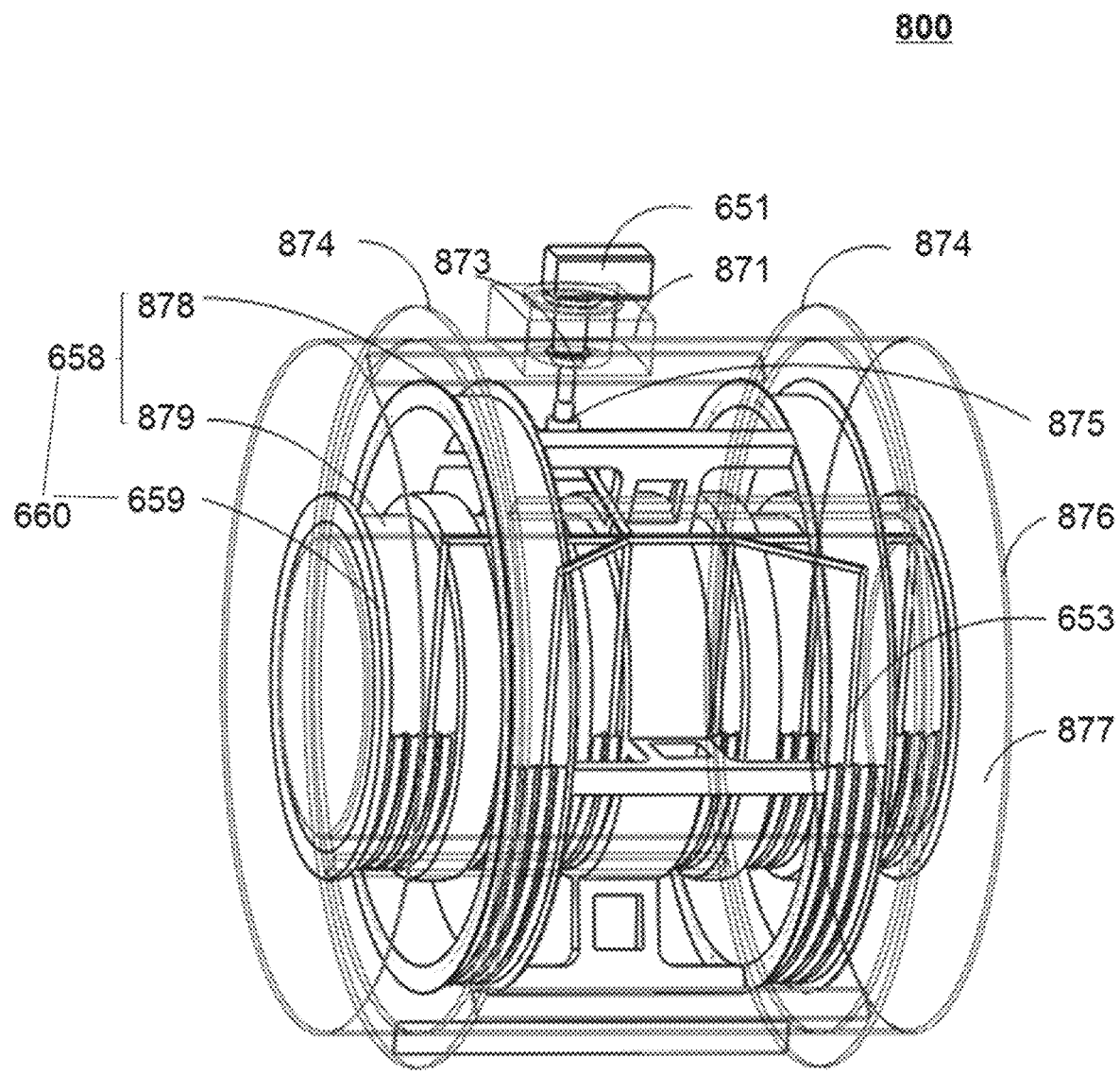
FIG. 8 is a schematic block diagram illustrating an exemplary MRI device according to some embodiments of the present disclosure.
Figure 9:
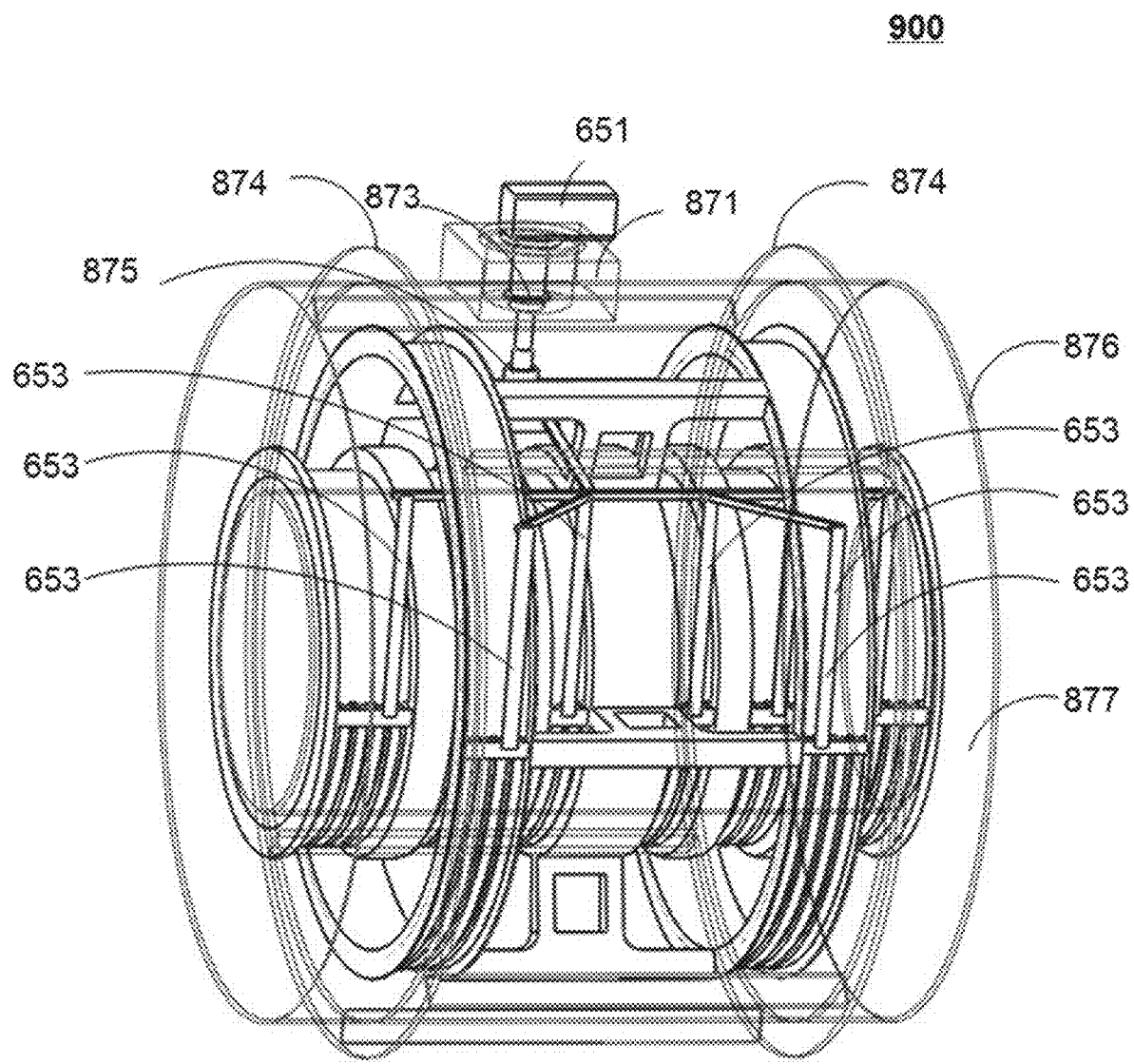
FIG. 9 is a schematic block diagram illustrating an exemplary MRI device according to some embodiments of the present disclosure.

In some embodiments, the superconducting magnet system 600 may include the support structure 659, the magnet coils 658 disposed on the support structure 659, and the at least one shell structure 655. The at least one shell structure 655 may be disposed around the circumference of the magnet coils 658. At least one chamber 761 may be formed based on the at least one shell structure 655 and the support structure 659. The at least one chamber 761 may be filled with the cooling medium. The cooling medium may be in thermal contact with the magnet coils 658. At least one thermal conduction structure 653 may be provided between the refrigeration device 651 and the at least one shell structure 655. The first end 654 of the at least one thermal conduction structure 653 may be thermally coupled with the cooling medium, and the second end 657 may be thermally coupled with the refrigeration device 651. It should be understood that the type of the refrigeration device 651 is not limited in the present disclosure, as long as it can cool the magnet coils 658 to or maintain the magnetic coils 658 at a superconducting state. It should be understood that the present disclosure does not limit the position of the cold head 873 (e.g., as shown in FIGS. 8-9) of the refrigeration device 651. In some embodiments, the cold head 873 of the refrigeration device 651 may be disposed relatively closed to the magnet coils 658, reducing the heat transfer path between the refrigeration device 651 and the magnet coils 658, thereby in turn reducing the heat loss during the heat transfer and improving the cooling efficiency of the magnet coils 658. In some embodiments, the refrigeration device 651 may be disposed on the support structure 659.

The present disclosure also provides an MRI device including the superconducting magnet system 600. The MRI device may be applied in an MRI system (e.g., the MRI system 100).

Merely by way of example, FIG. 8 is a schematic block diagram illustrating an exemplary MRI device according to some embodiments of the present disclosure. In some embodiments, as shown in FIG. 8, an MRI device 800 may include a superconducting magnet 660. The superconducting magnet 660 may include a support structure 659 and magnet coils 658 disposed on the support structure 659. The magnet coils 658 may include at least one group of field coil 879 and at least one group of shield coils 878. At least one shell structure 655 may be disposed around the circumference of the magnet coils 658. At least one chamber 761 may be formed based on the at least one shell structure 655 and the support structure 659. The at least one chamber 761 may be filled with a cooling medium. The cooling medium may be in thermal contact with at least part of the magnet coils 658. The MRI device 800 may further include an outer vacuum container 876 including an accommodating space 877 to accommodate the superconducting magnet 660 and the at least one shell structure 655. In some embodiments, the at least one shell structure 655 may be provided with at least one through hole. The first end 654 of the at least one thermal conduction structure 653 may pass through the at least one through hole into the at least one chamber 761 and be immersed in the cooling medium. At least a portion of the refrigeration device 651 may be disposed outside the outer vacuum container 876. For example, the compressor of the refrigeration device 651 may be disposed outside the accommodating space 877, and the secondary cold head 875 of the refrigeration device 651 may extend into the accommodating space 877 to facilitate heat transfer between the cooling medium and the refrigeration device 651 to cool the cooling medium. In some embodiments, the MRI device 800 may include a service tower 871 disposed outside the outer vacuum container 876. The service tower 871 may be configured to provide a thermal shield for the primary cold head 873. In some embodiments, a flange butt joint to tighten the sealing ring in the compression flange groove may be used to make the space between the refrigeration device 651 and the service tower 871 sealed, which may form a thermal shield structure, so as to realize the thermal shield of the primary cold head 873 of the refrigeration device 651 and reduce the heat load of the primary cold head 873. In some embodiments, the MRI device 800 may include a strengthening structure 874 (e.g., a strengthening rib) disposed surrounding the outer vacuum container 876. The strengthening structure 874 may be configured to strengthen the outer vacuum container 876.

In some embodiments, the cooling process of the MRI device 800 may include the following operations. A liquid cooling medium may be filled into the at least one chamber 761. The compressor and the cold head 873 of the refrigeration device 651 may operate so that the cold head 873 inside the accommodating space 877 may provide cooling energy corresponding to temperature of 4.2 Kelvins (K). Heat transfer may be performed between the refrigeration device 651 and the liquid cooling medium through the at least one thermal conduction structure 653 to cool the cooling medium. As the temperature of the cooling medium drops below the freezing point of the cooling medium, the liquid cooling medium may become solid. The solid cooling medium may be in good thermal contact with at least a portion of the surface of the magnet coils 658, which may facilitate a good heat transfer between the cooling medium and the magnet coils 658 to cool the magnet coils 658 to or maintain the magnetic coils 10 658 a superconducting state.

FIG. 9 is a schematic block diagram illustrating an exemplary MRI device according to some embodiments of the present disclosure. In some embodiments, as shown in FIG. 9, the at least one thermal conduction structure 653 in the MRI device 900 may be a tubular structure. The first end 654 of the at least one thermal conduction structure 653 may be in thermal connection with the at least one shell structure 655. Heat transfer between the at least one shell structure 655 and the cooling medium may be performed to cool the cooling medium.

In some embodiments, at least one thermal conduction structure 653 may be disposed between the refrigeration device 651 and the at least one shell structure 655. The at least one thermal conduction structure 653 may be a tubular structure and filled with a low-temperature medium (e.g., liquid helium). In some embodiments, the at least one thermal conduction structure 653 may be a double-layer vacuum tubular structure. The at least one thermal conduction structure 653 may include an inner cavity for accommodating the low-temperature medium.

When an MRI scan is performed using the superconducting magnet 660, local eddy current heating may occur on the magnet coils 658. When pure water or an ethanol aqueous solution is used as the cooling medium, the solid ice or solid ethanol solution ice may have a relatively high heat transfer rate, and may be in fully contact with the surface of the magnet coils 658, thereby in turn quickly take away the heat of the magnet coils 658.

The superconducting magnet system 600 provided in the present disclosure may have the advantages of low cost and simple structure. In the superconducting magnet system 600, heat transfer may be performed between the refrigeration device 651 and the magnet coils 658 to cool the magnet coils 658 to or maintain the magnetic coils 658 at a superconducting state. When the superconducting magnet system 600 is used in an MRI system (e.g., the MRI system 100), during a scan process based on an MR sequence, all magnet coils 658 do not easily accumulate hot spots with a risk of quenching of superconductivity, thereby improving the MRI system stability.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

The present disclosure provides a cooling structure for cooling magnet coils of an MRI system (e.g., the MRI system 100). A cooling medium may flow in the cooling structure. The cooling structure may be in thermal contact with at least a portion of the magnet coils. The cooling medium may absorb heat of the magnet coils to lower the temperature of the magnet coils so that the magnet coils are in a superconducting state.

In some embodiments, the magnet coils may be in a superconducting state of zero resistance below a critical temperature. The critical temperature may depend on the material of the magnet coils. In order to keep the cooling medium flowing in the cooling structure to cool the magnet coils to and/or maintain them at a superconducting state, the cooling medium may be a liquid of which the temperature is below the critical temperature. For example, the cooling medium may be liquid helium, a hyperpolarized material, etc. By the circulation of the cooling medium in the cooling structure, the cooling medium may absorb heat of the magnet coils to make the magnet coils in a superconducting state. The magnet coils does not need to be immersed in the cooling medium, which achieves the cooling effect and greatly reduce the consumption of the cooling medium, thereby in turn reducing costs and waste of the cooling medium.

In some embodiments, as shown in FIGS. 10-15, a cooling structure 1000 may include a cooling body 1010, an end cover 1020, and a plurality of pipes 1030. The cooling body 1010 may include a cooling passage 1041 through which the cooling medium flows. When the cooling body 1010 is used in an MRI system to cool magnet coils of the MRI system, the cooling body 1010 may be positioned in thermal contact with at least a portion of the magnet coils.

In some embodiments, the end cover 1020 may include two end components 1021 and 1022. The two end components may be respectively disposed on two ends (also referred to as a first end and a second end) of the cooling body 1010, along a flow direction of the cooling medium in the cooling body 1010. In some embodiments, the plurality of pipes 1030 may be configured to allow the cooling medium to enter or exit the cooling body 1010. The plurality of pipes 1030 may be disposed on the end cover 1020. In some embodiments, each of the two end components 1021 and 1022 may be provided with at least one plurality of pipes 1030.

In some embodiments, the end cover 1020 may be in physical connection with the cooling body 1010. For example, the end cover 1020 and the cooling body 1010 may be mechanically connected by welding, bonding, riveting, crimping, or the like, or any combination thereof, to achieve reliable connection and avoid leakage of the cooling medium from the cooling structure 1000.

In some embodiments, the cooling body 1010 may be a main structure of the cooling structure 1000 for cooling the magnet coils. In some embodiments, the cooling body 1010 may be a hollow structure including the cooling passage 1041 to allow the cooling medium to pass through. In some embodiments, the cooling medium may enter the cooling body 1010 from the first end of the cooling body 1010. During a process for cooling magnet coils, the cooling body 1010 may be in thermal contact with at least a portion of the magnet coils. Therefore, during the process in which the cooling medium flows from the first end to the second end in the cooling body 1010, the cooling medium may absorb heat of the magnet coils. The cooling medium that has absorbed the heat of the magnet coils may exit the cooling body 1010 from the second end of the cooling body 1010. The exited cooling medium may be cooled by a refrigeration device and re-enter the cooling body 1010 from the first end.

The magnet coils may be cooled by the circulating flow of the cooling medium in the cooling body 1010 to allow the magnet coils to maintain a superconducting state.

In some embodiments, each of the two end components 1021 and 1022 of the end cover 1020 may be a hollow structure including a liquid storage cavity. The liquid storage cavity may be in fluid communication with the cooling passage 1041 of the cooling body 1010. In some embodiments, an end of the liquid storage cavity may be open to connect with the first or second end of the cooling body 1010 so that the liquid storage cavity may be in fluid communication with the cooling passage 1041. An opposite end of the liquid storage cavity may be closed to prevent the cooling medium from leaking from the opposite end of the liquid storage cavity. In some embodiments, a cavity with two closed end may be formed based on the two liquid storage cavities of the end cover 1020 and the cooling passage 1041 to avoid leakage of the cooling medium from the cooling structure 1000.

In some embodiments, the at least one of the plurality of pipes 1030 disposed on the same end component (e.g., the end component 1021 or 1022) may have the same function for leading the cooling medium to entering or exiting the cooling structure 1000. For example, the at least one of the plurality of pipes 1030 disposed on the end component 1021 (or the end component 1022) at the first end of the cooling body 1010 may be used as an inlet of the cooling medium into the cooling structure 1000, and the at least one of the plurality of pipes 1030 disposed on the end component 1022 (or the end component 1021) at the second end of the cooling body 1010 may be used as an outlet of the cooling medium out of the cooling structure 1000.

In some embodiments, the cooling medium may enter a liquid storage cavity of the end cover 1020 from at least one of the plurality of pipes 1030 used as an inlet, and then enter the cooling body 1010 through the liquid storage cavity to cool the magnet coils by heat transfer. The cooling medium that has absorbed heat of the magnet coils may enter another liquid storage cavity of the end cover 1020, and then exit the cooling structure 1000 through at least one of the plurality of pipes 1030 used as an outlet.

In some embodiments, the plurality of pipes 1030 may be in thermal connection with a refrigeration device. The cooling medium that has absorbed the heat of the magnet coils may get hot or change into gas. The relatively hot cooling medium or the gaseous cooling medium may exit the cooling body 1010 and be re-cooled by the refrigeration device into a cold liquid cooling medium. The cold liquid cooling medium may re-enter the cooling body 1010, so that the cooling medium is recycled, thereby reducing costs and achieving the cooling effect.

In order to reduce the consumption of a cooling medium (e.g., liquid helium) for cooling magnet coils in an MRI system, the present disclosure provides a cooling structure 1000 for cooling the magnet coils. The cooling medium may be filled into the cooling structure 1000 to cool the magnet coils. The cooling structure 1000 may be used as a channel through which the cooling medium may flow. The cooling structure 1000 may be in thermal contact with at least a portion of the magnet coils so that the cooling structure 1000 may cool the magnet coils by heat transfer. In this way, only a small amount of the cooling medium may be used to meet the cooling requirement of the magnet coils, and there is no need to provide a large amount of the cooling medium to immerse the magnet coils therein.

In some embodiments, a superconducting magnet of an MRI system (e.g., the MRI system 100) may be a cylinder with a bore. Taking the MRI system 100 as an example, a superconducting magnet may be around and centered on a central axis. The central axis may be along the Z axis in FIG. 1A. The superconducting magnet may include magnet coils and a support structure on which the magnet coils are disposed. In some embodiments, the support structure may be a cylinder sleeve (e.g., a bobbin) around and centered on the central axis. In some embodiments, the magnet coils may include a plurality of coil groups. Each of the plurality of coil groups may be wound, e.g., along the circumferential direction of the support structure, around the support structure into a spiral with a cylindrical shape. A coil may spirally may extend along the central axis. The plurality of coil groups may be around and centered on the central axis. In some embodiments, the plurality of coil groups may be spatially separated from each other.

In some embodiments, when the cooling structure 1000 is used in the superconducting magnet of the MRI system 100, the cooling structure 1000 may be disposed so that the flow direction of the cooling medium may be along the circumferential direction of the magnet coils of the superconducting magnet. In this way, the size of the cooling body 1010 along the circumferential direction of the magnet coils (also the flow direction of the cooling medium in the cooling structure 1000) may refer to the length of the cooling body 1010. The size of the cooling body 1010 along the central axis of the superconducting magnet may refer to the width of the cooling body 1010. The size of the cooling body 1010 along the radial direction of the magnet coils may refer to the thickness or height of the cooling body 1010. The thickness or height of the cooling body 1010 may also refer to a distance between a contact surface of the cooling body 1010 with the magnet coils and a surface of the cooling body 1010 opposite to the contact surface.

In some embodiments, the cooling body 1010 may be a flat structure of which the thickness is smaller than the length and the width, which may lead to a relatively large contact surface of the cooling body 1010 with the magnet coils, facilitating heat transfer between the cooling medium and the magnet coils, thereby in turn achieving the cooling effect. In some embodiments, the flat cooling body 1010 may reduce the consumption of the cooling medium. In some embodiments, the cooling body 1010 may include an alloy material with good thermal conductivity, such as an aluminum alloy, a copper alloy, a zinc alloy, or the like, or any combination thereof. In some embodiments, the cooling body 1010 may be shaped by drawing molding or extrusion molding. In some embodiments, the thickness of the cooling body 1010 may be within a range from 1 mm to 30 mm, and the width of the cooling body 1010 may be within a range from 5 mm to 1000 mm.

Figure 10:
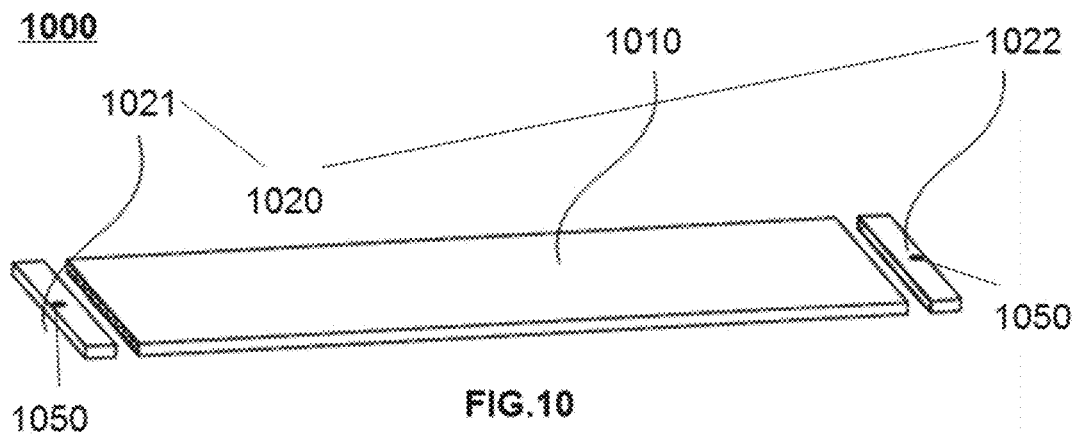
FIG. 10 is a schematic block diagram illustrating an exemplary cooling structure according to some embodiments of the present disclosure.
Figure 11:
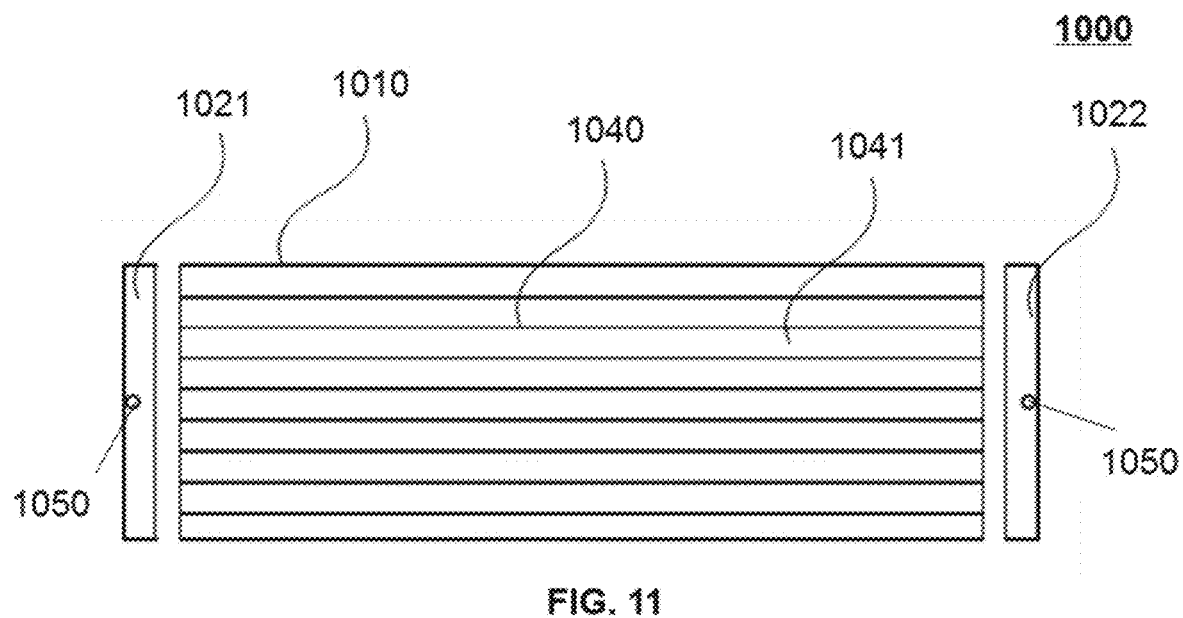
FIG. 11 is a schematic block diagram illustrating a top perspective view of an exemplary cooling structure according to some embodiments of the present disclosure.
Figure 12:
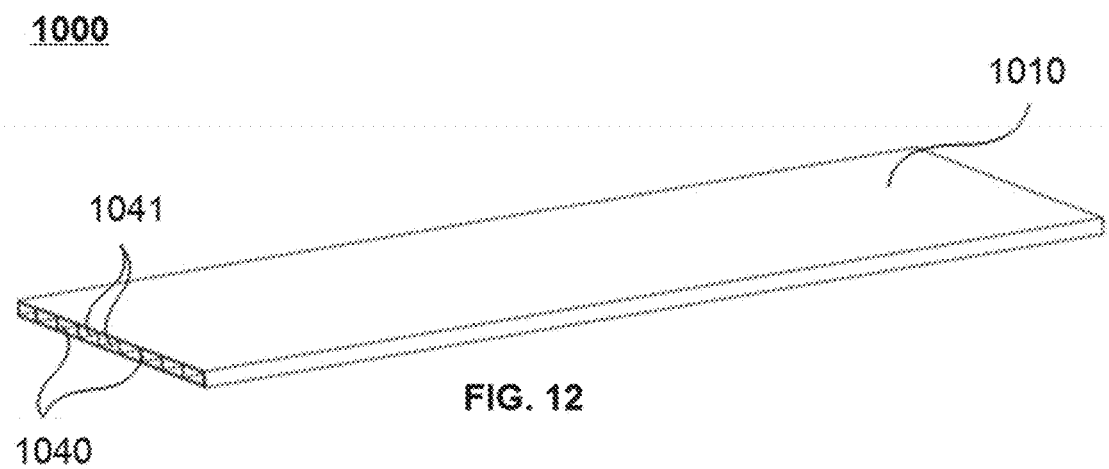
FIG. 12 is a schematic block diagram illustrating a cooling body of an exemplary cooling structure according to some embodiments of the present disclosure.
Figure 14:
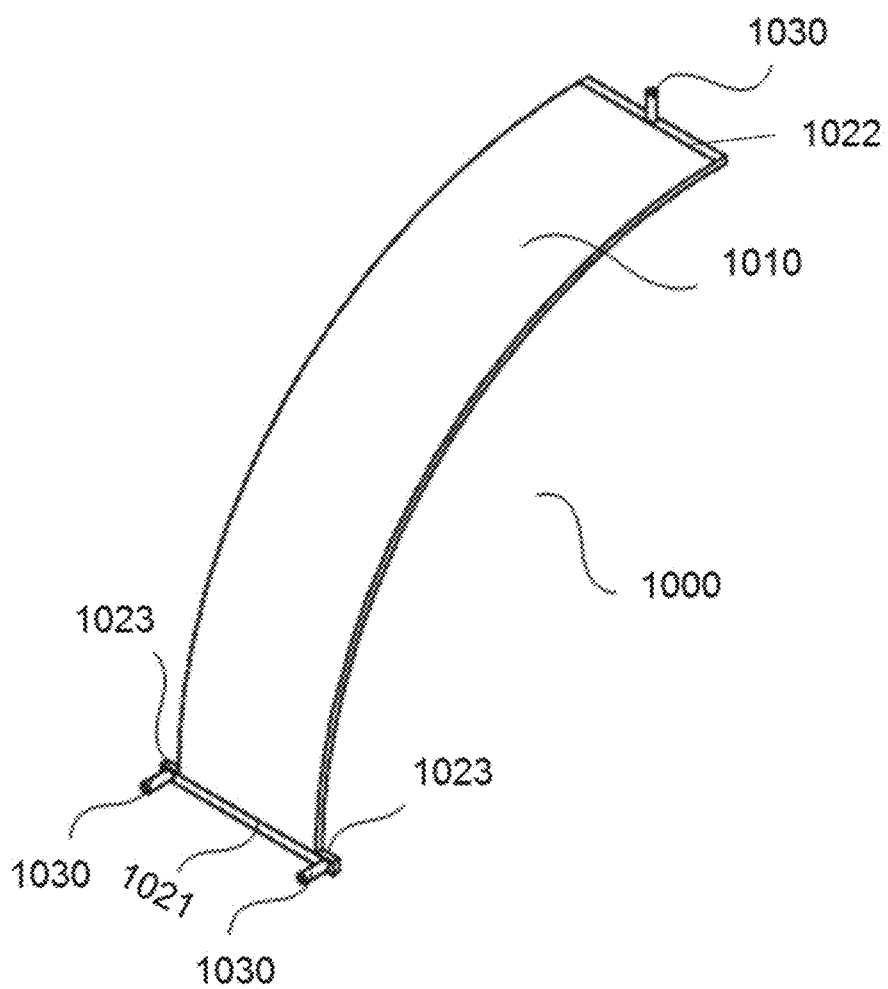
FIGS. 14-16 are schematic block diagrams illustrating an exemplary cooling structure according to some embodiments of the present disclosure.
Figure 15:
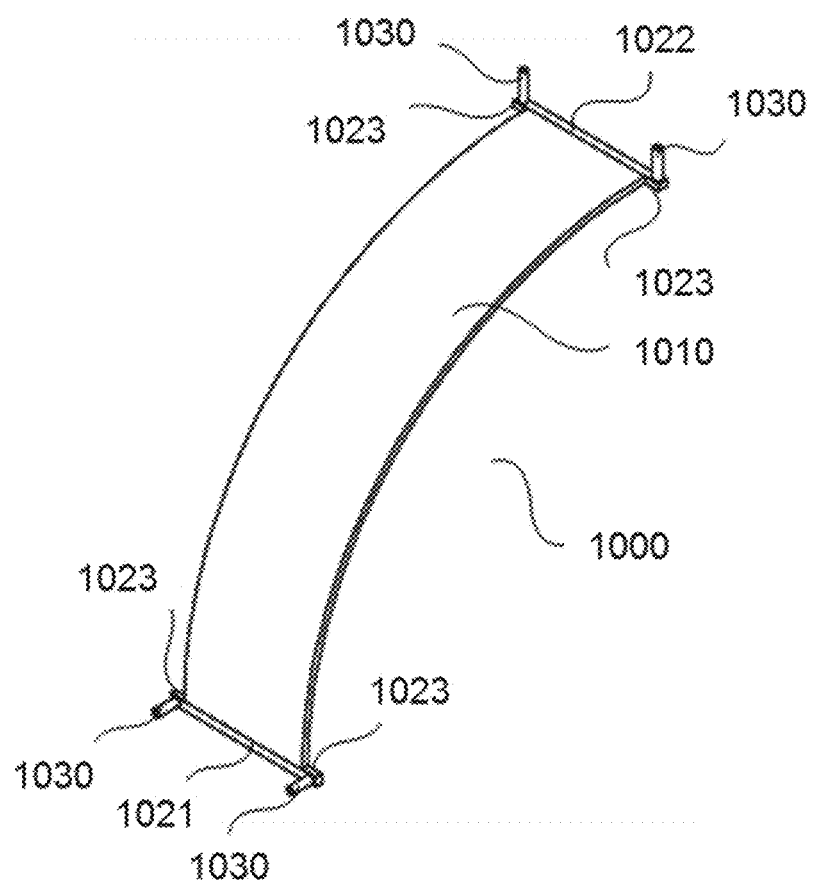

In some embodiments, the cooling body 1010 may be of an arc shape (as shown in FIGS. 14-15) or a circular shape. After drawing molding or extrusion molding, the cooling body 1010 may be of a flat plate shape, e.g., as shown in FIGS. 10-12. In order to match the circumference of the magnet coils and be in sufficient contact with the magnet coils, the cooling body 1010 of a flat plate shape may be further bent into an arc shape, e.g., as shown in FIGS. 14-15. In some embodiments, when the cooling body 1010 is used to cool one of a plurality of coils of a superconducting magnet, in order to match the circumference of the coil group and be in sufficient contact with the coil group, the difference between the radius of curvature of the curved cooling body 1010 and the radius of the coil group may be equal to or approximately equal to the thickness of the cooling body 1010.

In some embodiments, the end cover 1020 may include a plurality of mounting holes 1050. The plurality of mounting holes 1050 may be configured to mechanically mount the plurality of pipes 1030 on the end cover 1020. In some embodiments, the plurality of pipes 1030 may be disposed in the plurality of mounting holes 1050 by welding, bonding, riveting, crimping, or the like, or any combination thereof.

In some embodiments, the cooling structure 1000 may include a plurality of strengthening structures 1040 that are disposed in the cooling passage 1041 and configured to strengthen the cooling body 1010. In some embodiments, the plurality of strengthening structures 1040 may be attached to a top wall and a bottom wall, in thickness, of the cooling passage 1041.

Figure 13A:
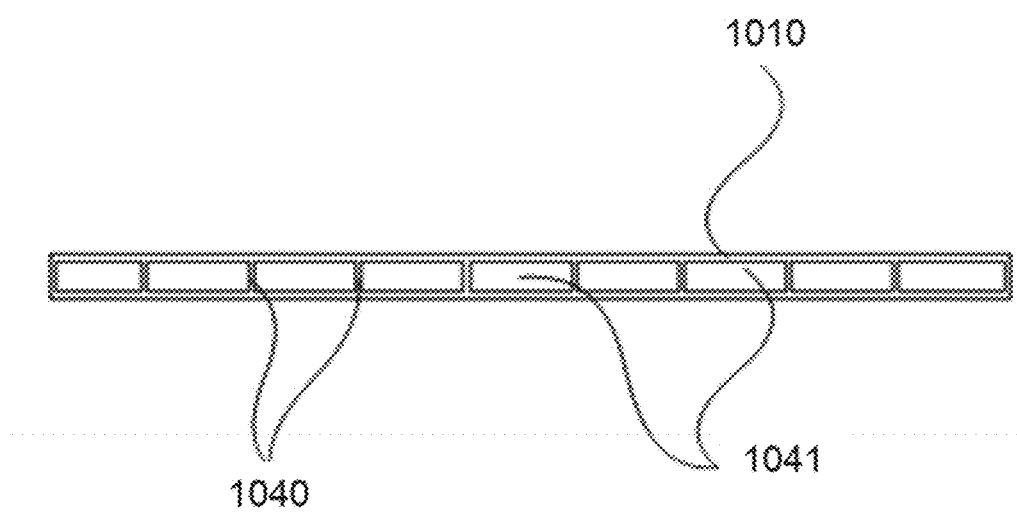
FIGS. 13A-13B are schematic block diagrams illustrating a side view of an exemplary cooling structure according to some embodiments of the present disclosure.

In some embodiments, as shown in FIGS. 11 and 13A, the plurality of strengthening structures 1040 may be disposed at intervals along the cooling passage 1041 of the cooling body 1010. For at least one of the plurality of strengthening structures 1040, an end of the strengthening structures 1040 may be attached to the top wall of the cooling passage 1041, and an opposite end of the strengthening structures 1040 may be attached to the bottom of the cooling passage 1041 to reliably support the hollow cooling body 1010, increase the strength of the cooling body 1010, and improve the winding capacity of the cooling body 1010 around the magnet coils.

In some embodiments, as shown in FIGS. 11 and 13A, the plurality of strengthening structures 1040 may divide the cooling passage 1041 into a plurality of sub-passages spatially separated from each other so that the cooling medium in each of the plurality of sub-passages may not be mixed, thereby avoiding turbulent flow of the cooling medium and improving the cooling effect.

In some embodiments, the liquid storage cavities of the end cover 1020 may be in fluid communication with the plurality of sub-passages. The cooling medium may enter the liquid storage cavity of the end component 1021 (or 1022) and be distributed into the plurality of sub-passages. After flowing through the cooling body 1010, the distributed flows of the cooling medium may converge in the liquid storage cavity of the end component 1022 (or 1021) and exit the cooling structure 1000.

Figure 13B:
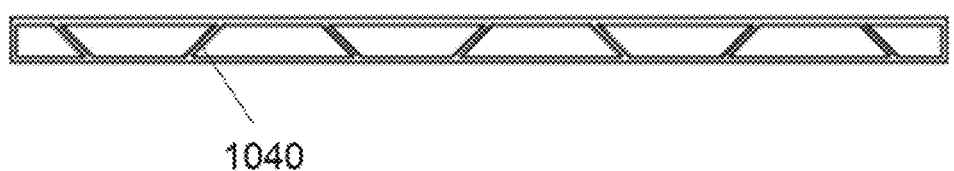

The shapes of the cross-section, in thickness, of the plurality of strengthening structures 1040 may be any shape, as long as the cooling body 1010 can be reliably supported. For example, as shown in FIGS. 13A-13B, the shapes of the cross-section of the plurality of strengthening structures 1040 may be quadrilateral. As another example, the shapes of the cross-section of the plurality of strengthening structures 1040 may be arc or a shape of a broken line. In some embodiments, as shown in FIG. 13A, the plurality of strengthening structures 1040 may be vertical to the top wall and/or the bottom wall of the cooling passage 1041. In some embodiments, as shown in FIG. 13B, the plurality of strengthening structures 1040 may be sloping relative to the top wall and/or the bottom wall of the cooling passage 1041. In some embodiments, the material of the plurality of strengthening structures 1040 may be the same as the material of the cooling body 1010. In some embodiments, the shapes of the cross-section of the plurality of strengthening structures 1040 may be the same or different.

In some embodiments, at least one of the plurality of pipes 1030 may be disposed on each of the two end components 1021 and 1022. In some embodiments, the numbers (or counts) of the pipes 1030 on the end components 1021 and 1022 may be the same or different. For example, as shown in FIGS. 10 and 11, the end components 1021 and 1022 may be provided with one pipe 1030, respectively. As another example, as shown in FIG. 14, the end component 1021 may be provided with two pipes 1030 and the end component 1022 may be provided with one pipes 1030. As still another example, as shown in FIG. 15, the end component 1021 may be provided with two pipes 1030 and the end component 1022 may be provided with two pipes 1030.

In some embodiments, as shown in FIGS. 10 and 11, the pipe 1030 may be disposed at the center along the width of the cooling body 1010, of the end component 1021 or 1022, which may make the cooling medium flow evenly in the cooling body 1010. In some embodiments, the pipe 1030 may be disposed off the center along the width of the cooling body 1010, of the end component 1021 or 1022. When the cooling structure 1000 is in contact with the inner surface of the magnet coils, if the pipe 1030 is disposed in the center position of the end component 1021 or 1022, there may be no space for allowing the pipe 1030 to protrude from the magnet coils. In this case, the pipe 1030 may be disposed at the edge, along the width of the cooling body 1010, of the end component 1021 or 1022.

In some embodiments, as shown in FIGS. 14-15, at least one end, along the width of the cooling body 1010, of the end component 1021 and the end component 1022 may protrudes beyond a side of the cooling body 1010. The side of the cooling body 1010 may be between the first and second ends of the cooling body 1010. At least one of the plurality of pipes 1030 may be disposed on the at least one protruding end 1023.

When the cooling structure 1000 is in contact with the inner surface of the magnet coils, there may be no space in the magnet coils for allowing the pipe 1030 to protrude from the magnet coils. If the end cover 1020 are configured with the at least one protruding end 1023, the at least one protruding end 1023 may be disposed in the support structure and the pipe 1030 on the at least one protruding end 1023 may protrude from the support structure, without providing a through hole on the magnet coils, thereby allowing the cooling medium easily enter and/or exit the cooling body 1010.

In some embodiments, the end components 1021 and 1022 may include one protruding end 1023, respectively. Two pipes 1030 may be disposed on the two protruding ends 1023, respectively. In some embodiments, as shown in FIG. 14, the end component 1021 may include two protruding ends 1023, and the end component 1022 may include no protruding end 1023. Two pipes 1030 may be disposed on the two protruding ends 1023 of the end component 1021, respectively. One pipes 1030 may be disposed in the middle position, along the width of the cooling body 1010, of the end component 1022. In some embodiments, as shown in FIG. 15, the end components 1021 and 1022 may include two protruding ends 1023, respectively. Four pipes 1030 may be disposed on the four protruding ends 1023, respectively. It should be noted that the relationship between the at least one protruding end 1023 and the plurality of pipes 1030 is not limited to the above, and at least the manner of configuring at least one of the plurality of pipes 1030 through the at least one protruding end 1023 should fall within the protection scope of the present disclosure.

In some embodiments, multiple cooling bodies 1010 may be applied in a superconducting magnet of an MRI system (e.g., the MRI system 100) for cooling magnet coils of the superconducting magnet. In some embodiments, the magnet coils may include a plurality of coil groups. Each coil group may be cooled using at least one of the multiple cooling bodies 1010.

Figure 16:
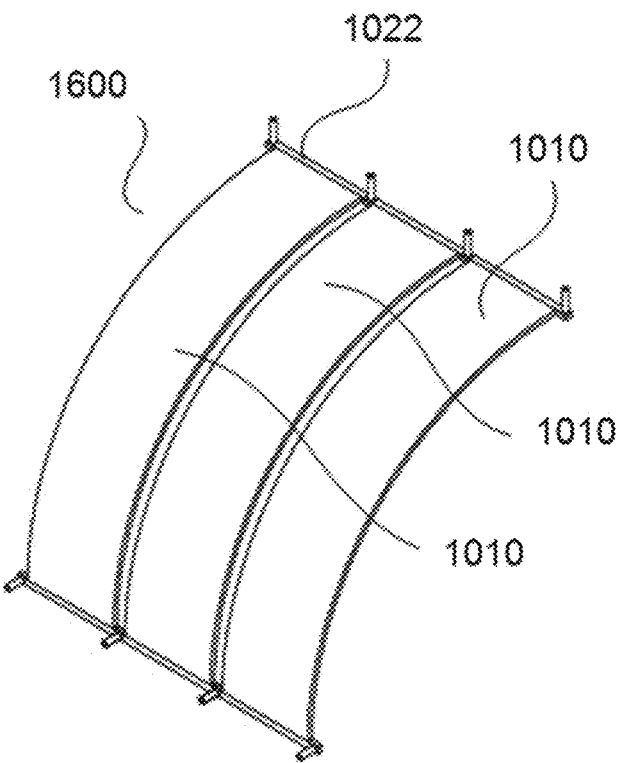

In some embodiments, two or more of the multiple cooling bodies 1010 may be mechanically connected. The two or more mechanically connected cooling bodies 1010 may be used to cool the same coil group. In some embodiments, as shown in FIG. 16, the two or more of the multiple cooling bodies 1010 may be mechanically connected side by side through at least one end cover 1020 so that the two or more of the multiple cooling bodies 1010 may be disposed along the central axis of the superconducting magnet. In other words, the two or more of the multiple cooling bodies 1010 may be in series connection in width.

In some embodiments, the two or more of the multiple cooling bodies 1010 may be mechanically connected end to end through at least one end cover 1020 so that the two or more of the multiple cooling bodies 1010 may be disposed along the circumferential direction of the superconducting magnet. In other words, the two or more of the multiple cooling bodies 1010 may be in series connection in length.

In some embodiments, the two or more of the multiple cooling bodies 1010 may be mechanically connected end to end into an arc structure. In some embodiments, the two or more of the multiple cooling bodies 1010 may be mechanically connected end to end into a circle structure. In some embodiments, each of the two or more of the multiple cooling bodies 1010 may be provided with an end cover 1020. The two or more of the multiple cooling bodies 1010 may be mechanically connected end to end through the end covers 1020. In this case, the two or more of the multiple cooling bodies 1010 may be separated from each other. The cooling medium may independently circulate in each of the two or more of the multiple cooling bodies 1010. In some embodiments, the two or more of the multiple cooling bodies 1010 may be mechanically connected so that the two or more of the multiple cooling bodies 1010 may be in fluid communication to form a channel. The end cover 1020 may be disposed at two ends of the channel. In this case, a cavity with two closed ends may be formed based on the two or more of the multiple cooling bodies 1010 and the end cover 1020.

Figure 17:
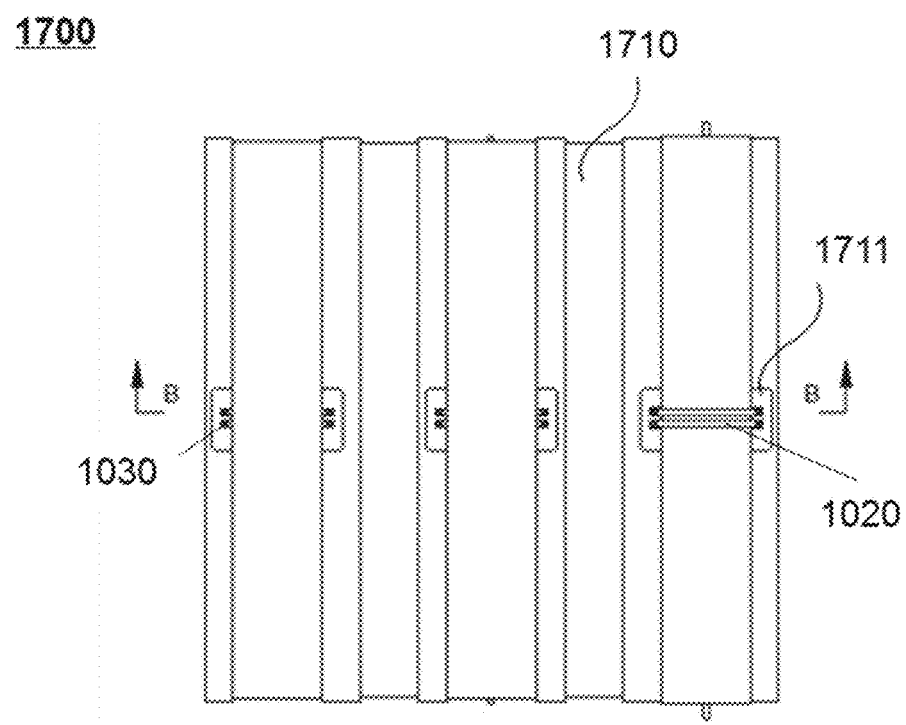
FIG. 17 is a schematic block diagram illustrating a top view of an exemplary MRI device according to some embodiments of the present disclosure.
Figure 18:
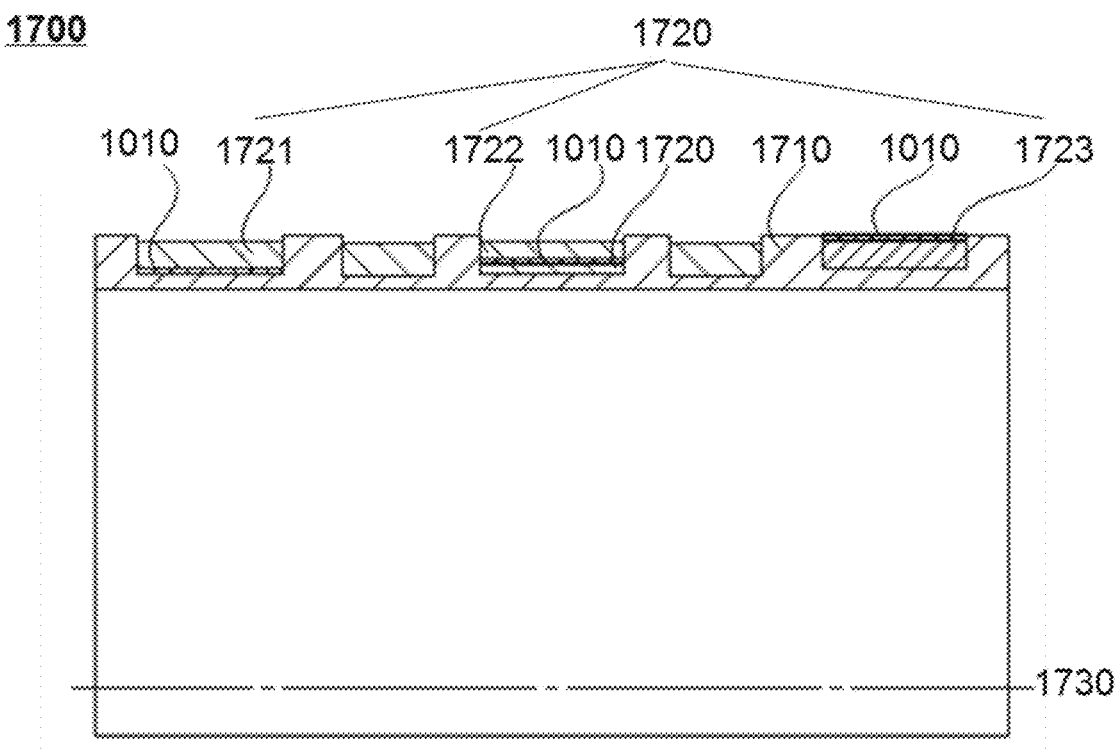
FIG. 18 is a schematic block diagram illustrating a cross-sectional view of an exemplary MRI device according to some embodiments of the present disclosure.
Figure 19:
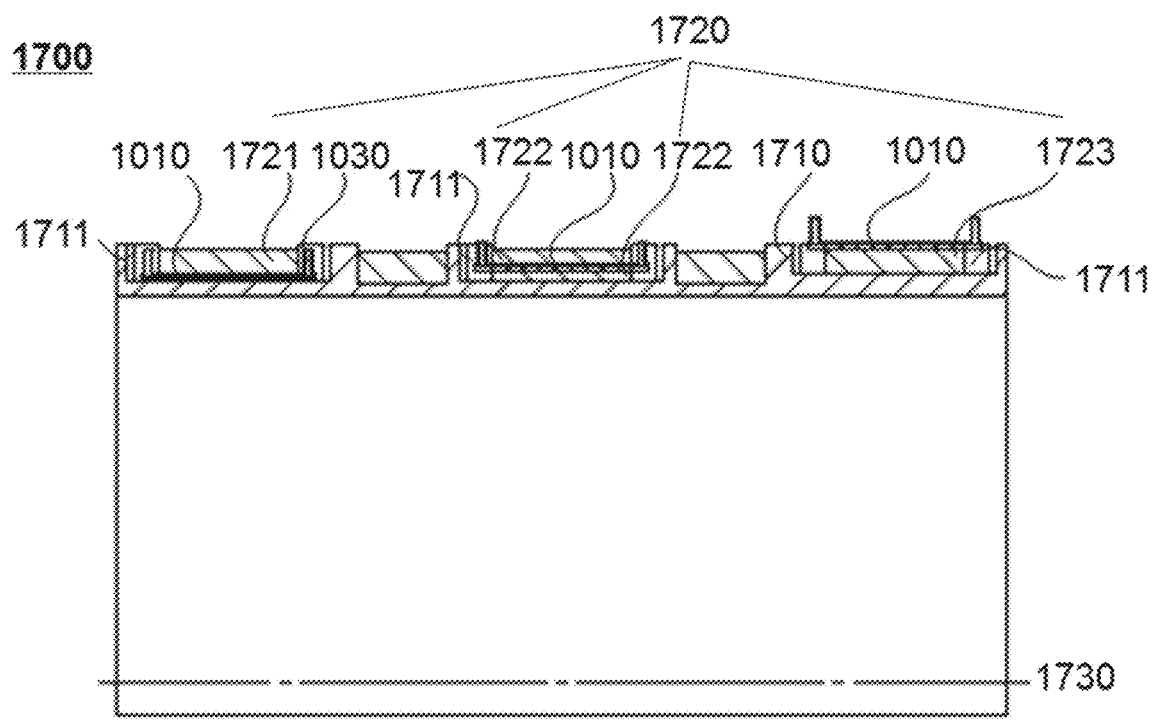
FIG. 19 is a schematic block diagram illustrating a cross-sectional view of the exemplary MRI device shown in FIG. 17 at B-B according to some embodiments of the present disclosure.

The present disclosure also provides a magnet device. The magnet device may be applied in a superconducting magnet of an MRI system (e.g., the MRI system 100). For example, as shown in FIGS. 17-19, a magnet device 1700 may include a support structure 1710, magnet coils 1720 wound around the support structure 1710, and a plurality of cooling structures 1000.

In some embodiments, the support structure 1710 may be a cylinder sleeve (e.g., a bobbin) around and centered on a central axis 1730 of the magnet device 1700. In some embodiments, the magnet coils 1720 may include a plurality of coil groups (e.g., coil groups 1721-1723 in FIGS. 18-19). Each of the plurality of coil groups may be wound, e.g., along the circumferential direction of the support structure 1710, around the support structure 1710 into a spiral with a cylindrical shape. A coil may spirally may extend along the central axis 1730. The plurality of coil groups may be around and centered on the central axis 1730. In some embodiments, the plurality of coil groups may be spatially separated from each other. In some embodiments, the magnet coils 1720 may be wound along the outer cylinder surface of the support structure 1710 or the inner cylinder surface of the support structure 1710.

In some embodiments, the plurality of cooling structures 1000 may be in thermal contact with the outer cylinder surface and/or the inner cylinder surface of the magnet coils 1720 for cooling the magnet coils 1720.

In some embodiments, two or more arc-shaped cooling bodies 1010 may be mechanically connected into a circle or an arc using a manner described above. The two or more connected cooling bodies 1010 may be in thermal contact with the magnet coils 1720.

In some embodiments, the support structure 1710 may include a plurality of winding slots that are spatially separated from each other along the central axis 1730. The plurality of winding slots may extend along the circumference of the support structure 1710. In some embodiments, one of the plurality of coils of the magnet coils 1720 may be wound around one of the plurality of winding slots. In some embodiments, the plurality of winding slots may limit the position of the magnet coils 1720 so that the magnet coils 1720 may be around and centered on the central axis 1730.

In some embodiments, each of the plurality of coil groups may include one or more coils. If one of the plurality of coil groups includes two or more coils, the two or more coils may be stacked, along a radial direction of the support structure 1710, around the support structure 1710.

In some embodiments, at least one of the plurality of the cooling structures 1000 may be disposed between the support structure 1710 and the magnet coils 1720. For example, as shown in FIGS. 18-19, at least one of the plurality of the cooling structures 1000 may be disposed between the support structure 1710 and the coil group 1721. The at least one of the plurality of the cooling structures 1000 may be in thermal contact with the inner cylinder surface of the coil group 1721.

In some embodiments, if one of the plurality of coil groups includes two or more coils, at least one of the plurality of the cooling structures 1000 may be disposed between any neighboring coils of the two or more coils. For example, as shown in FIGS. 18-19, the coil group 1722 may include two coils. At least one of the plurality of the cooling structures 1000 may be disposed between the two coils of the coil group 1722. The at least one of the plurality of the cooling structures 1000 may be in thermal contact with the inner cylinder surface of one of the two coils in the coil group 1722, and in thermal contact with the outer cylinder surface of another coil in the coil group 1722.

In some embodiments, at least one of the plurality of the cooling structures 1000 may be disposed along the outer cylinder surface of the magnet coils 1720. For example, as shown in FIGS. 18-19, at least one of the plurality of the cooling structures 1000 may be in thermal contact with the outer cylinder surface of the coil group 1723.

In some embodiments, for one of the plurality of coils, the total size, along the central axis 1730, of the at least one of the plurality of cooling structures 1000 used to cool the coil group may be equal to, smaller than, or larger than the size of the coil group along the central axis 1730. For example, if the combination structure 1600 in FIG. 16 is used to cool one of the coil group 1721, a sum of the widths of the three cooling structures 1000 of the combination structure 1600 may be equal to, larger than, or smaller than the size of the coil group 1721 along the central axis 1730.

In some embodiments, when at least one of the plurality of cooling structures 1000 is disposed on the inner cylinder surface of a coil group (e.g., the coil group 1721) or between two coils of a group coils (e.g., the coil group 1722), the total size, along the central axis 1730, of the at least one of the plurality of cooling structures 1000 may be equal to or smaller than the size of the coil group along the central axis 1730, preventing the coil group from moving along the central axis 1730. In some embodiments, when at least one of the plurality of cooling structures 1000 is disposed on the outer cylinder surface of a coil group (e.g., the coil group 1723), the total size, along the central axis 1730, of the at least one of the plurality of cooling structures 1000 may be equal to, larger than, or smaller than the size of the coil group along the central axis 1730.

In some embodiments, the total width, along the central axis 1730, of at least one of the plurality of cooling structures 1000 used to cool a coil group may be equal to, smaller than, or larger than the size of the coil group along the central axis 1730.

In some embodiments, the magnet coils 1720 may be press-fitted on the cooling structure 1000, or may be fixed on the cooling structure 1000 by pouring glue.

In some embodiments, as shown in FIGS. 17 and 19, in order to avoid interference between the plurality of pipes 1030 and the magnet coils 1720, the support structure 1710 may include at least one opening 1711 configured to accommodate the plurality of pipes 1030. In some embodiments, the at least one protruding end 1023 of the cooling structure 1000 and the pipe 1030 disposed on the at least one protruding end 1023 may be disposed in the at least one opening 1711. In this way, the magnet coils 1720 may be wound directly on the cooling structure 1000 without touching the plurality of pipes 1030 of the cooling structure 1000.

In some embodiments, as shown in FIG. 19, at least one cooling structure 1000 used to cool the coil group 1721 may be disposed between the support structure 1710 and the coil group 1721. The pipes 1030 of the at least one cooling structure 1000 used to cool the coil group 1721 may be located at two sides, along the central axis 1730, of the coil group 1721, and may be in the opening 1711 corresponding to the coil group 1721. At least one cooling structure 1000 used to cool the coil group 1722 may be disposed between two coils of the coil group 1722. The pipes 1030 of the at least one cooling structure 1000 used to cool the coil group 1722 may be located at two sides, along the central axis 1730, of the coil group 1722, and may be in the opening 1711 corresponding to the coil group 1722. At least one cooling structure 1000 used to cool the coil group 1723 may be disposed along the outer cylinder surface of the coil group 1723. The pipes 1030 of the at least one cooling structure 1000 used to cool the coil group 1723 may not affect the coil group 1723. In this case, the pipes 1030 of the at least one cooling structure 1000 used to cool the coil group 1723 may be disposed at any location, e.g., at two ends or the middle location along the central axis 1730, of the end cover 1020.

In some embodiments, the at least one cooling structure 1000 applied in each coil group may be the same or different in, e.g., the structure, the count, or the connection manner of the at least one cooling structure 1000, or the location relative to the each coil group.

After the assembly of the magnet device 1700 based on the support structure 1710, the magnet coils 1720, and the plurality of cooling structures 1000, the cooling medium may be filled into the plurality of cooling structures 1000 to cool the magnet coils 1720. With the cooling structure 1000, the consumption of the cooling medium may be greatly reduced, thereby in turn reducing the cost of the cooling medium and waste of the cooling medium.

The present disclosure also provides an MRI system including the magnet device 1700. The MRI system may achieve the cooling of magnet coils to a superconducting state using a cooling medium, and reduce the consumption of the cooling medium, the cost of the cooling medium, and the waste of the cooling medium.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claimed subject matter may lie in less than all features of a single foregoing disclosed embodiment.

What is claimed is:

1. A superconducting magnet, comprising:
   magnet coils including at least one group of outer coils and at least one group of inner coils;
   a container including an accommodating space that is enclosed by an inner wall of the container, a cooling chamber and an outer chamber being disposed within the accommodating space;
   at least one first chamber that is disposed within the cooling chamber and houses the at least one group of the inner coils;
   at least one second chamber that is disposed within the cooling chamber and houses the at least one group of the outer coils,
   wherein the at least one first chamber and the at least one second chamber are configured to be filled with a cooling medium and are in fluid communication with each other,
   the cooling medium being configured to cool the magnet coils to a superconducting state,
   the outer chamber being outside and separate from the cooling chamber; and
   a control valve being configured to control a fluid communication between the outer chamber and the cooling chamber.

2. The superconducting magnet of claim 1, further comprising:
   a third chamber disposed within the accommodating space, the at least one first chamber and the at least one second chamber being in fluid communication with each other through the third chamber.

3. The superconducting magnet of claim 2, further comprising:
   an intermediate support structure disposed within the accommodating space;
   a first sealing structure disposed within the accommodating space, the first sealing structure being located closer to a central axis of the superconducting magnet than the intermediate support structure; and
   a plate structure disposed between the first sealing structure and the intermediate support structure, the plate structure, the first sealing structure, and the intermediate support structure being in a sealed connection, and the at least one first chamber being formed based on the intermediate support structure, the first sealing structure, and the plate structure, wherein
   a first gap is disposed between the plate structure and the container, and
   a second gap is disposed between the plate structure and the at least one group of inner coils.

4. The superconducting magnet of claim 3, further comprising:
   an inner support structure disposed within the at least one first chamber, the at least one group of inner coils being disposed on the inner support structure;
   an outer support structure disposed within the accommodating space, the at least one group of outer coils being disposed on the outer support structure, the intermediate support structure being located closer to the central axis of the superconducting magnet than the outer support structure; and a second sealing structure disposed within the accommodating space, the outer support structure being located closer to the intermediate support structure than the second sealing structure, the at least one second chamber being formed based on the outer support structure and the second sealing structure.

5. The superconducting magnet of claim 2, further comprising:
a refrigeration device configured to cool the cooling medium, the refrigeration device being thermally coupled with at least one of the at least one first chamber, the at least one second chamber, or the third chamber, the refrigeration device being disposed on the container, at least a portion of the refrigeration device being located outside the accommodating space.

6. The superconducting magnet of claim 5, wherein:
the outer chamber is formed based on an outer wall of the cooling chamber and the inner wall of the container.

7. The superconducting magnet of claim 6, further comprising:
a connection passage connecting the refrigeration device and the cooling chamber; and
an exhaust passage disposed on the connection passage wherein
the control valve is disposed on the connection passage.

8. The superconducting magnet of claim 6, further comprises:
a connection passage connecting the refrigeration device and the cooling chamber, wherein the connection passage includes at least one opening, the cooling chamber being in fluid communication with the outer chamber through the at least one opening.

9. A superconducting magnet, comprising:
magnet coils including at least one group of outer coils and at least one group of inner coils;
a container including an accommodating space that is enclosed by an inner wall of the container, a cooling chamber and an outer chamber being disposed within the accommodating space;
a support structure on which the at least one group of outer coils or the at least one group of inner coils are disposed;
a shell structure disposed around the at least one group of outer coils or the at least one group of inner coils;
at least one first chamber being formed based on the support structure and the shell structure, and configured to house the at least one group of the inner coils and be disposed within the cooling chamber;
at least one second chamber being formed based on the support structure and the shell structure, and configured to house the at least one group of the outer coils and be disposed within the cooling chamber,
wherein the at least one first chamber and the least one second chamber are configured to be filled with a cooling medium and are in fluid communication with each other,
the cooling medium being configured to cool the magnet coils to a superconducting state,
the outer chamber being outside and separate from the cooling chamber; and
a control valve being configured to control a fluid communication between the outer chamber and the cooling chamber.

10. The superconducting magnet of claim 9, wherein
the shell structure is an arc structure that extends along a circumferential direction of the magnet coils; or
the shell structure is a circle structure that is arranged around a periphery of the magnet coils.

11. The superconducting magnet of claim 9, further comprising:
a refrigeration device configured to cool the cooling medium; and
a thermal conduction structure including a first end and a second end, the first end being thermally coupled with the cooling medium, the second end being thermally coupled with the refrigeration device, the thermal conduction structure being configured to facilitate heat transfer between the refrigeration device and the cooling medium to cool the cooling medium.

12. The superconducting magnet of claim 11, wherein the shell structure includes a hole, the first end of the thermal conduction structure entering the at least one first chamber or the at least one second chamber through the hole and being configured to be immersed in the cooling medium.

13. The superconducting magnet of claim 11, wherein a material of the shell structure is metal, the first end of the thermal conduction structure being thermally connected with the shell structure, the thermal conduction structure being configured to facilitate heat transfer between the refrigeration device and the cooling medium through the shell structure.

* * * * *